(12) United States Patent
Dougherty et al.

(10) Patent No.: US 6,198,509 B1
(45) Date of Patent: Mar. 6, 2001

(54) METHOD AND APPARATUS FOR PROVIDING AND RECEIVING BROADCASTER INFORMATION

(75) Inventors: Brian P. Dougherty; Eric E. Del Sesto, both of Alameda, CA (US)

(73) Assignee: Wink Communications, Inc., Alameda, CA (US)

(*) Notice: Subject to any disclaimer, the term of this patent is extended or adjusted under 35 U.S.C. 154(b) by 0 days.

(21) Appl. No.: 08/942,705

(22) Filed: Oct. 1, 1997

Related U.S. Application Data

(63) Continuation of application No. 08/429,064, filed on Apr. 26, 1995, now abandoned.

(51) Int. Cl.[7] ....................................... H04N 7/10
(52) U.S. Cl. .......................... 348/467; 348/461; 725/139
(58) Field of Search ................. 348/6, 7, 10, 11, 348/13, 12, 906, 461, 463, 465, 467, 468, 473, 477, 478, 499, 53, 552; 455/3.1, 4.1, 6.1, 6.2, 6.7; 709/217–219; 345/327

(56) References Cited

U.S. PATENT DOCUMENTS

| | | | |
|---|---|---|---|
| 4,965,825 | * 10/1990 | Harvey et al. | 380/9 |
| 5,353,121 | 10/1994 | Young et al. | 348/563 |
| 5,532,754 | * 7/1996 | Young et al. | 348/569 |
| 5,585,866 | * 12/1996 | Miller et al. | 348/731 |

\* cited by examiner

*Primary Examiner*—Nathan Flynn
(74) *Attorney, Agent, or Firm*—Fenwick & West LLP

(57) ABSTRACT

A method and apparatus identifies a tuned frequency or other information about a broadcaster or an interactive information system application using a description of the broadcaster or application, allowing an interactive information system to be easily controlled without requiring an information provider to identify a tuned frequency or other information. An information provider broadcasts broadcaster information to a reception component, and the reception component may identify the desired tuned frequency or other information using this broadcaster information. This allows interactive information system applications to locate a desired frequency or other information without requiring knowledge of information specific to each geographic or other boundary.

17 Claims, 20 Drawing Sheets

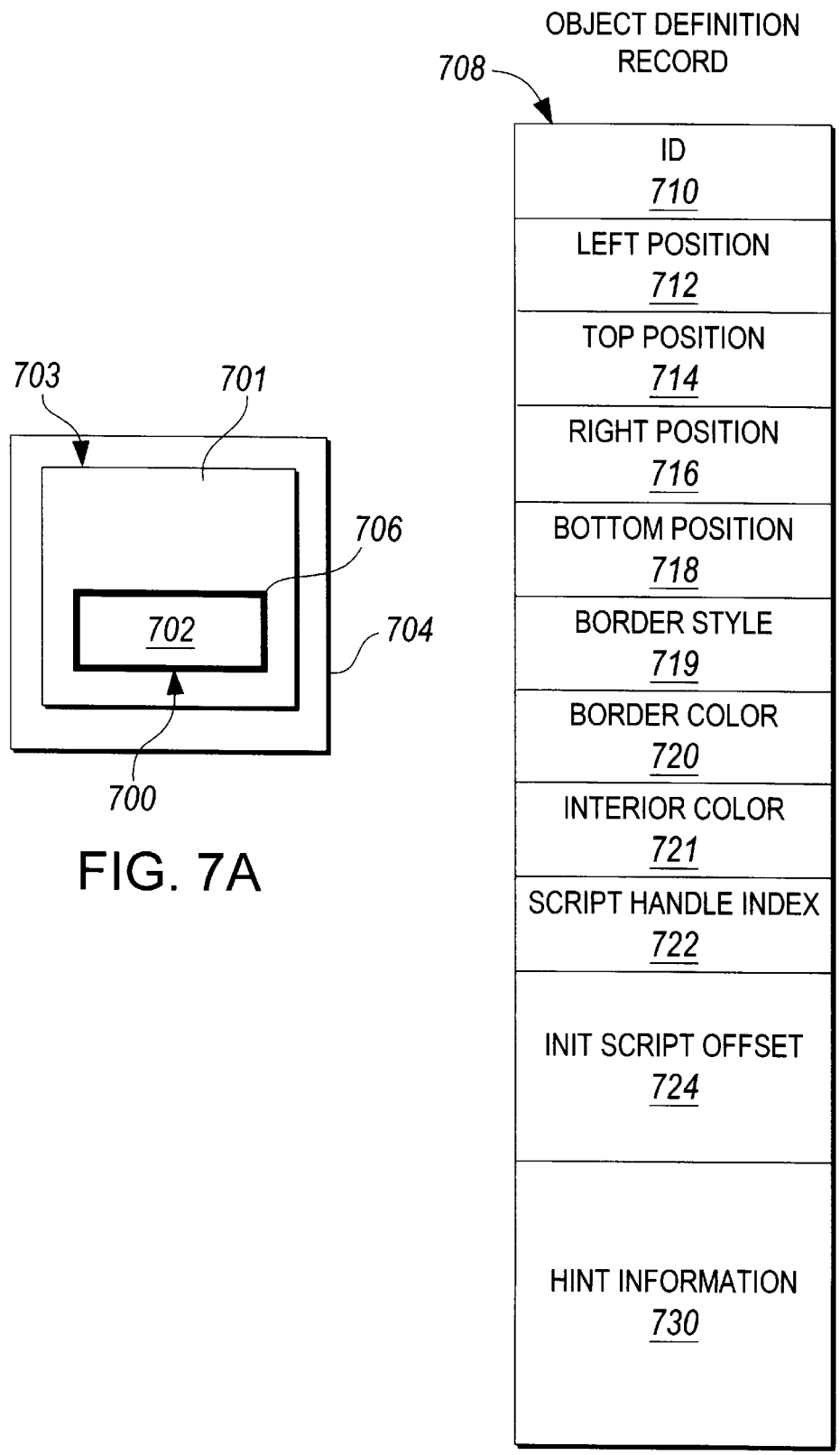

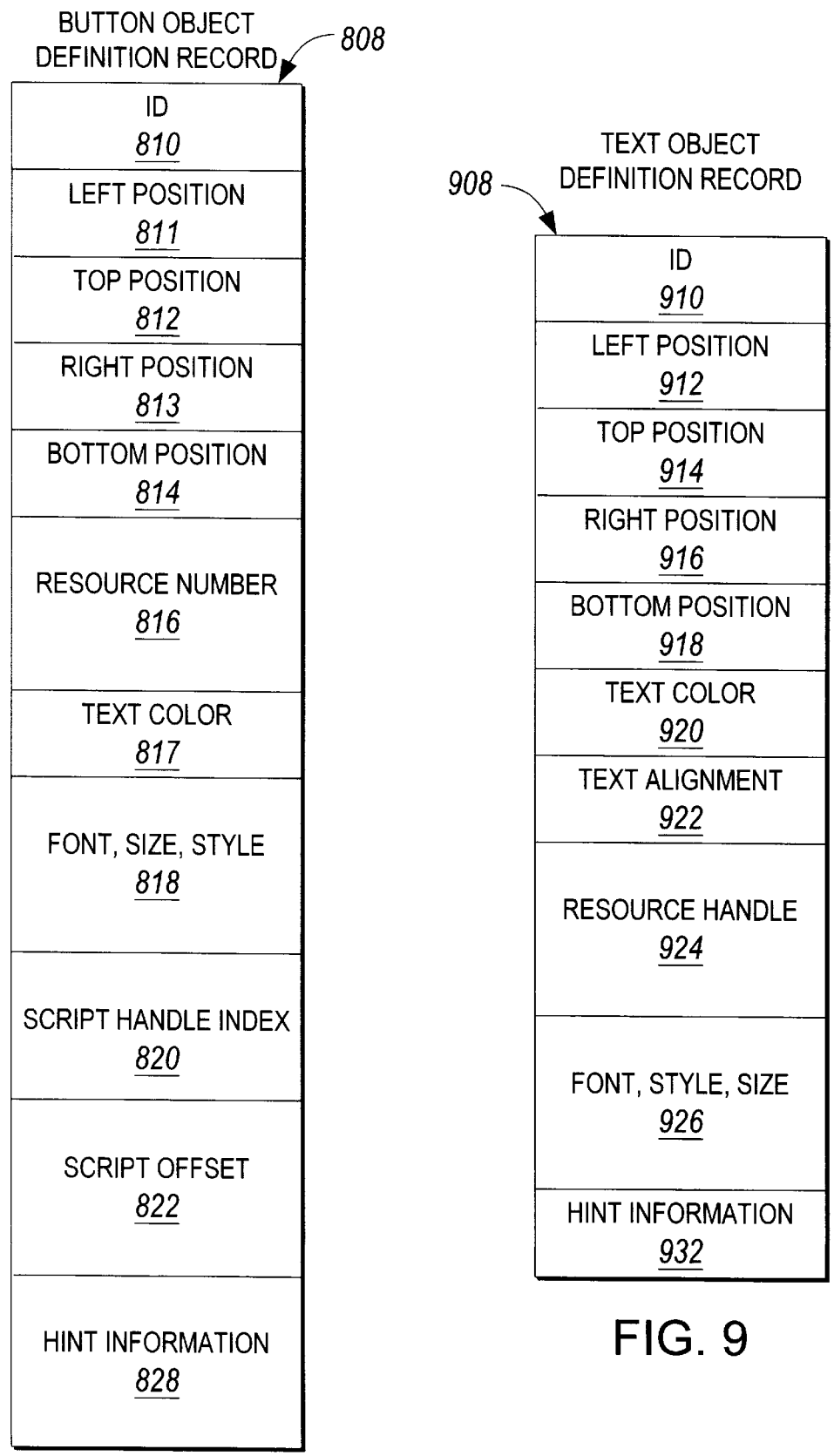

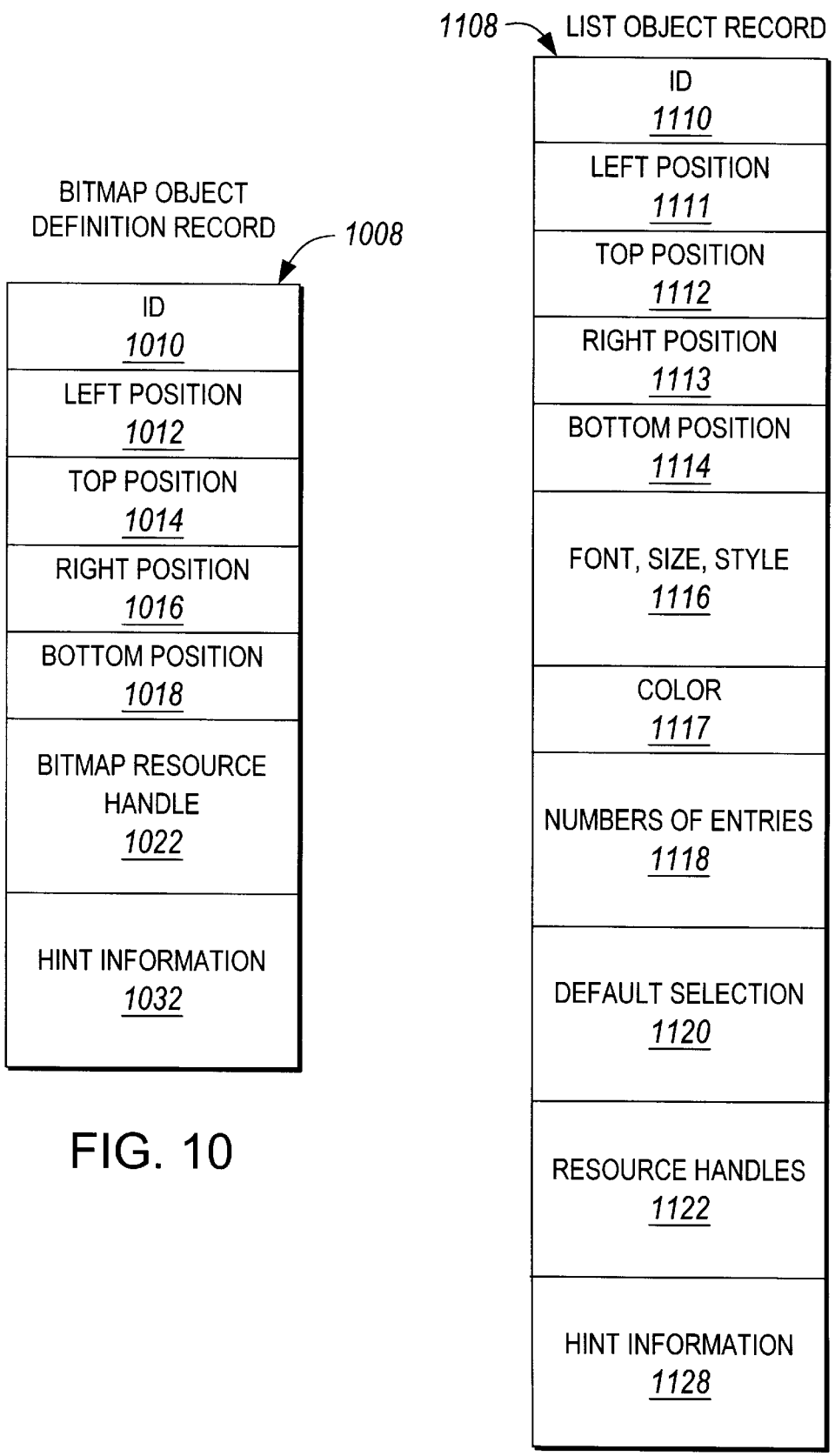

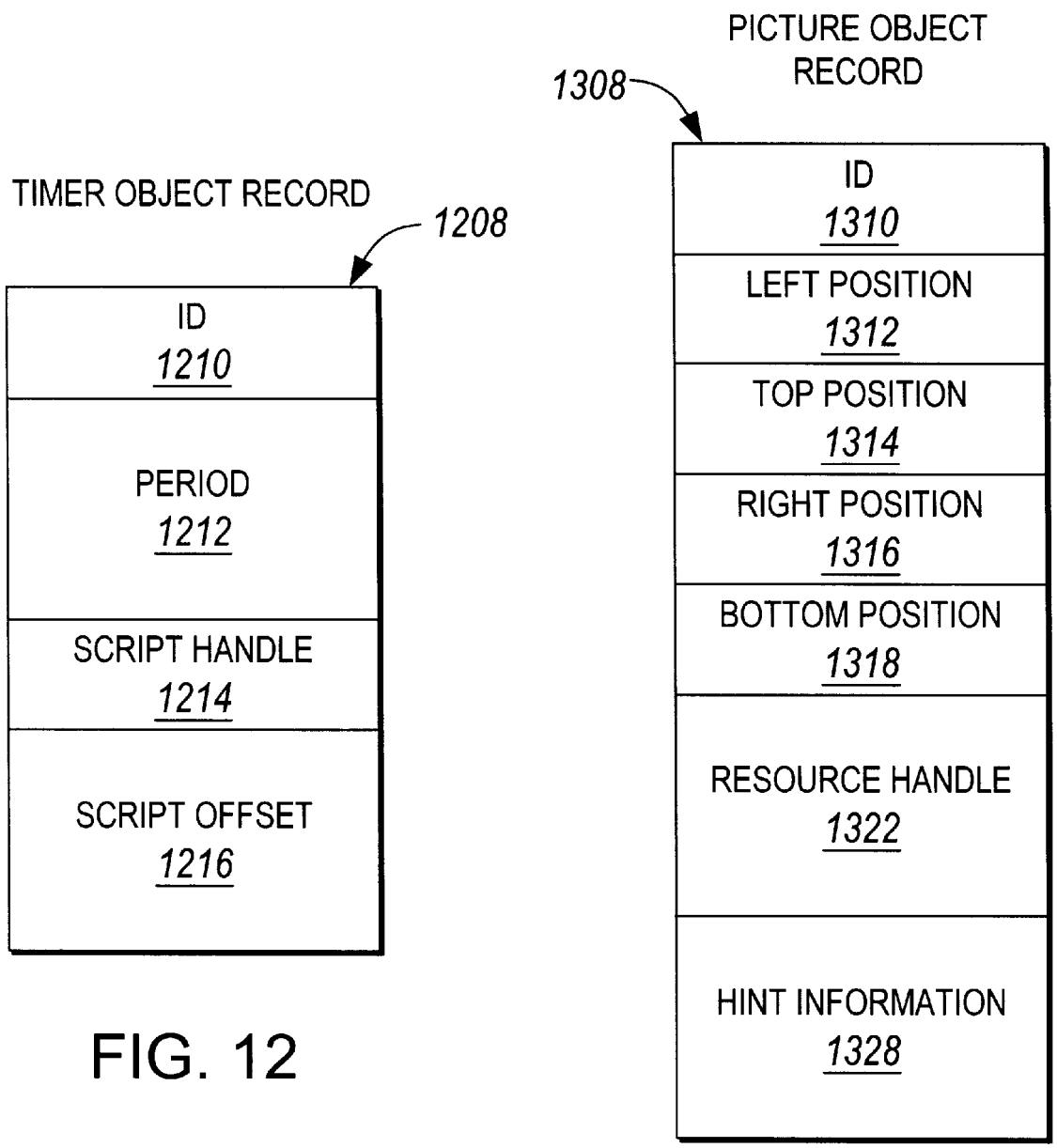

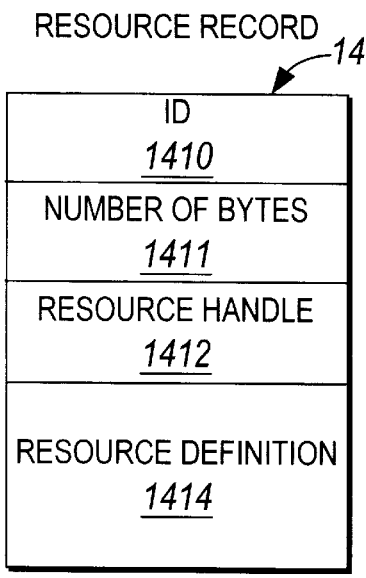
FIG. 14A
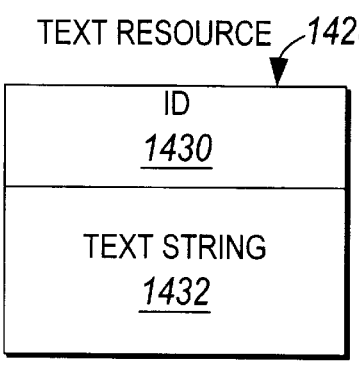
FIG. 14B
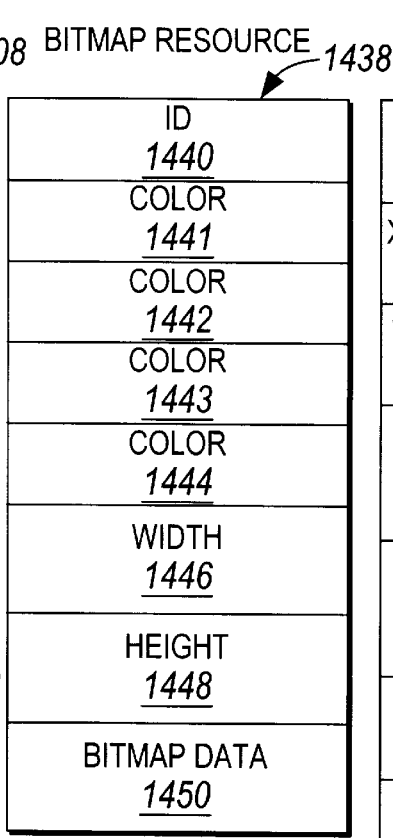
FIG. 14C
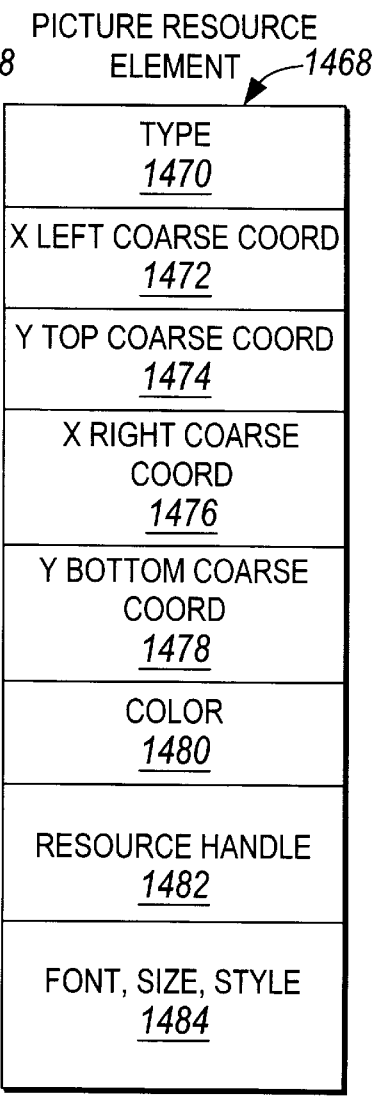
FIG. 14E
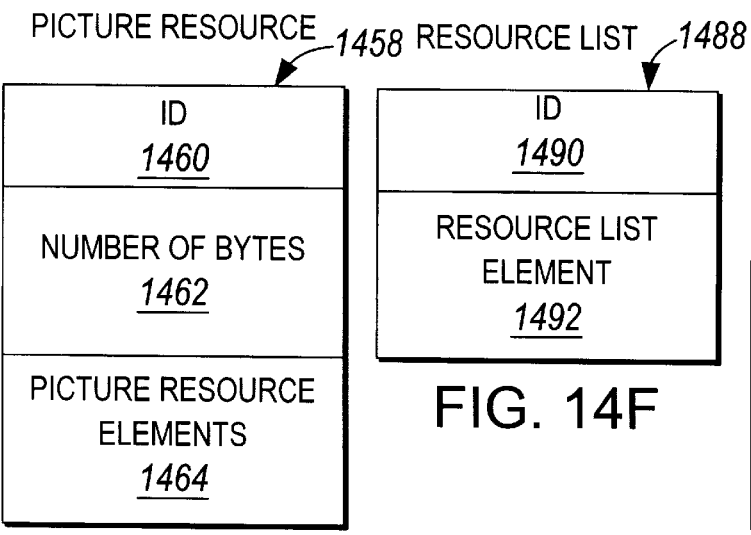
FIG. 14D
FIG. 14F
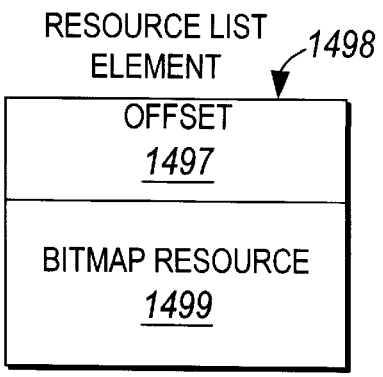
FIG. 14G

METHOD AND APPARATUS FOR PROVIDING AND RECEIVING BROADCASTER INFORMATION

RELATED APPLICATIONS

This is a continuation of application(s) Ser. No. 08/429,064 filed on Apr. 26, 1995 now abandoned.

The subject matter of this application is related to the subject matter of the following applications: application Ser. No. 08/429,107, entitled, "COMPACT GRAPHICAL INTERACTIVE INFORMATION SYSTEM", and application Ser. No. 08/429,109, entitled "METHOD AND APPARATUS FOR ROUTING CONFIDENTIAL INFORMATION", each of the above applications filed by Eric E. Del Sesto and Brian P. Dougherty on Apr. 25, 1995, having the same assignee as the present invention and incorporated herein by reference in their entirety.

FIELD OF INVENTION

The present invention relates to broadcast and receiving systems, and more specifically, to interactive broadcast and receiving systems.

BACKGROUND OF INVENTION

Interactive information systems allow an information provider to broadcast information to a user, and in some cases allow a user to send a response to a response collector. The user may receive the information on a wide variety of devices, such as a pager, cellular telephone, personal digital assistant or a television. An interactive information system on which the user receives the information using a television is called an interactive television system.

An interactive television system can enhance the television viewing experience. An interactive television system allows an information provider to broadcast information to users for viewing on their television systems, and defines how a user is allowed to control the time, order or type of information displayed, or other aspects of the application or the user's environment. An interactive television system may allow the user to send to a response collector responses to the information received, or new information.

Some capabilities which could be provided using interactive information systems require the use of broadcaster information which can be specific to a group of users, a broadcaster or an information provider. Broadcaster information includes broadcast channels available to the user, the broadcast frequency corresponding to the channel, call letters corresponding to a broadcaster on the channel, network identifiers for the broadcasters, or interactive information protocol or location information for a broadcast or an application.

For example, to provide an interactive information system capability which lists a channel guide of available cable television channels, it is necessary to identify which channels a user is capable of receiving. This information varies among cable systems, making it difficult to provide this capability to an interactive user community which spans multiple cable systems. To provide an interactive information system capability which allows a user to change television channels by indicating a desired network or station call letters, it is necessary to know which channels are used to carry the desired station, or which channels are used to carry the desired network's programming. Channel information varies among cable systems, and network information varies among geographic region, making it difficult to provide this capability to an interactive user community which spans multiple cable systems or geographic regions.

Some interactive information systems which utilize a variety of methods to broadcast interactive information may require certain information in order to operate properly. For example, one broadcaster may broadcast interactive information on a frequency unrelated to the broadcast program, and another broadcaster may broadcast interactive information in the same frequency as the broadcast program. Identification of the program broadcast frequency, interactive information broadcast frequency and data transport mechanism may be necessary to coordinate broadcast programs with the interactive applications which relate to the program. Some interactive information may be broadcast unrelated to any broadcast program, and it is desirable to allow the user to access this information in a manner similar to accessing broadcast channels.

Knowledge of the interactive information broadcast frequency may not be adequate to obtain the interactive information. For example, some interactive information systems use the vertical blanking interval, or VBI, to transport the interactive information to the user. The VBI is a portion of the television picture which is broadcast, but not typically seen by the television viewer, and readily allows for insertion of data, such as closed captioning text. However, the various portions, or lines, of the VBI may be used for different purposes, and the use of the VBI may vary in various geographic regions, making a uniform placement of interactive data difficult or impossible. It may be necessary for an interactive information system which uses the VBI or other transport to identify the precise VBI or other transport location of the interactive information.

Interactive information system applications may not only relate to the content of a broadcast program, they may also relate to one another. To allow interactive information system applications to interact with one another, it may be necessary to identify the broadcast location of the interactive data for other applications. A broadcast location may include frequency and transport information, such as VBI line.

Many interactive information system protocols may be used to broadcast interactive information. To allow an interactive information system to utilize various interactive information system protocols, it is desirable to identify which protocol is in operation on a particular frequency and transport mechanism.

Because interactive information providers may provide interactive information for use over a wide geographic region, it would be cumbersome to require an information provider to identify all of this information for each user, and provide customized interactive information based upon the information identified.

SUMMARY OF INVENTION

A method and apparatus allows a user's reception component to identify broadcaster information. Because the reception component can identify some or all of this information, the interactive information provider making use of the broadcaster information may use a common reference across a wide geographic region, for example "change channel to CNN", relying on the user's reception component to adapt the reference to the user's specific broadcaster information.

A BRIEF DESCRIPTION OF THE DRAWINGS

FIG. 7A is an illustration of a conventional television display with a form according to one embodiment of the present invention.

FIG. 7B is a block diagram representing a format of a form object definition record according to one embodiment of the present invention.

FIG. 8 is a block diagram representing a format of a button object definition record according to one embodiment of the present invention.

FIG. 9 is a block diagram representing a format of a text object definition record according to one embodiment of the present invention.

FIG. 10 is a block diagram representing a format of a bitmap object definition record according to one embodiment of the present invention.

FIG. 11 is a block diagram representing a format of a list object definition record according to one embodiment of the present invention.

FIG. 12 is a block diagram representing a format of a timer object definition record according to one embodiment of the present invention.

FIG. 13 is a block diagram representing a format of a picture object definition record according to one embodiment of the present invention.

FIG. 14A is a block diagram representing a format of a resource definition record according to one embodiment of the present invention.

FIG. 14B is a block diagram representing a format of a text resource according to one embodiment of the present invention.

FIG. 14C is a block diagram representing a format of a bitmap resource according to one embodiment of the present invention.

FIG. 14D is a block diagram representing a format of a picture resource according to one embodiment of the present invention.

FIG. 14E is a block diagram representing a format of a picture resource element according to one embodiment of the present invention.

FIG. 14F is a block diagram representing a format of a resource list according to one embodiment of the present invention.

FIG. 14G is a block diagram representing a format of a resource list element according to one embodiment of the present invention.

DETAILED DESCRIPTION OF A PREFERRED EMBODIMENT

I. Example

Figure 1:
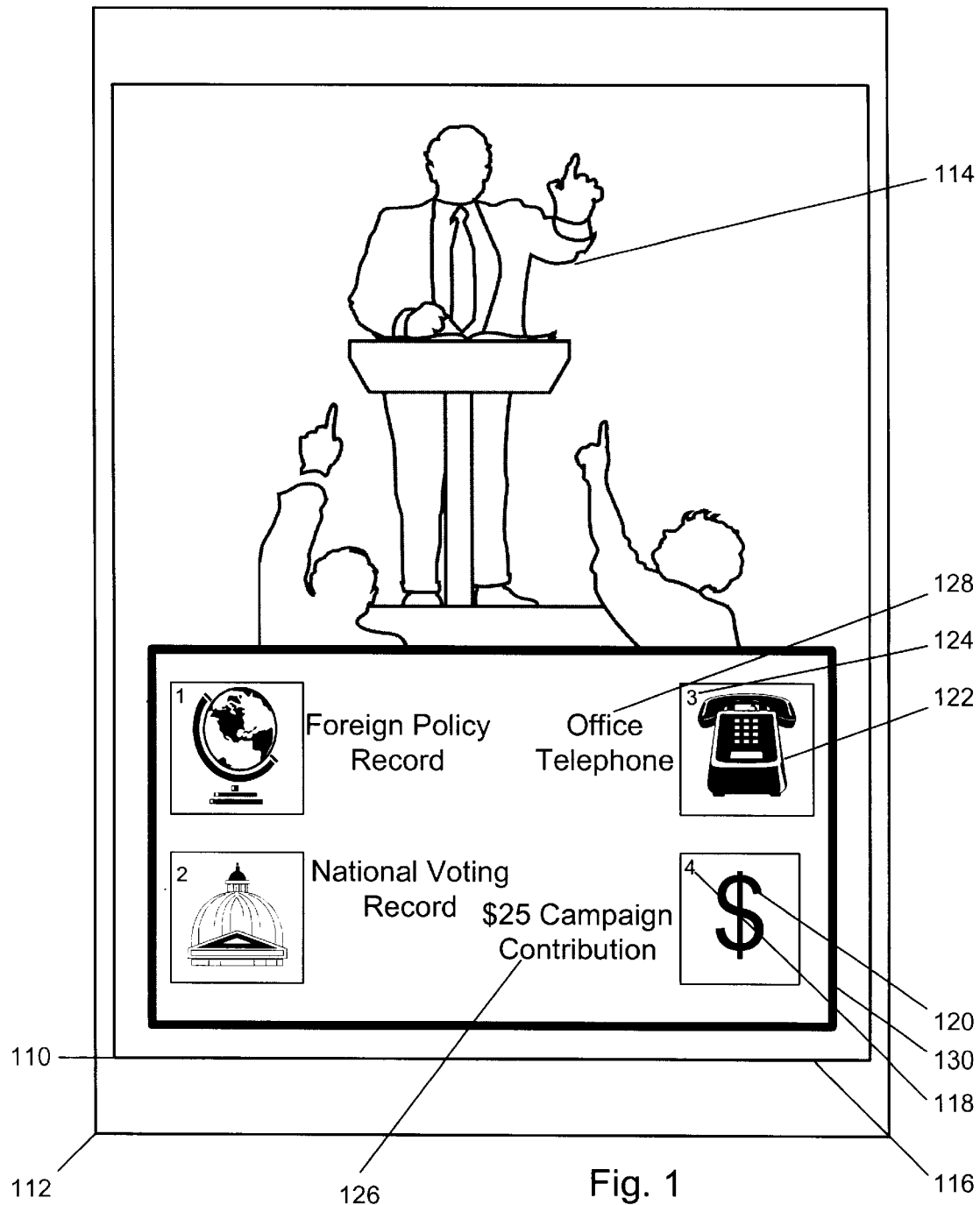
FIG. 1 is an illustration of a conventional television screen displaying a conventional television program with a graphical interactive information system application displayed according to one embodiment of the present invention.

Referring now to FIG. 1, a sample graphical interactive television system application display is shown. A display screen 110 of a conventional television 112 displays a conventional television show which contains a politician 114 giving a speech. A graphical interactive information system application form 116 having a border 130 is displayed by the graphical interactive television system on the screen 110 of the television 112. The form 116 may contain text descriptions 126, 128 and pictures or icons 120, 122 corresponding to buttons 118, 124 to allow the user to make a selection by pressing a numeric key using a conventional television remote control device. When the user indicates a selection by pressing a remote control key corresponding to a button 118, 124, a new form may be displayed containing additional information relating to the indicated selection. In one embodiment, one or more selections may cause the graphical interactive television system to send response information to a response collector which may or may not be the information provider. For example, button 118 can allow the user to make a $25 campaign contribution to the candidate 114. If during the broadcast program a second candidate follows the first candidate 114, an identical form 116 may be displayed related to information or a response collector different from that relating to the first candidate 114.

Graphical interactive information is communicated to the user by broadcasting graphical interactive information system applications. A graphical interactive information system application is a set of definitions, commands, scripts and data which may be used to produce a graphical user interface, determine how a user may control the graphical interactive information system application and external devices and control and define response information. Graphical interactive applications may be broadcast to correspond to other information broadcast, such as in the example of FIG. 1 above. When the graphical interactive application is broadcast to correspond to a broadcast program, it is called a program application. When the graphical interactive application is broadcast to correspond to an advertisement, it is called an advertisement application. A graphical interactive application may be broadcast which does not relate to a broadcast program or advertisement, and such an application is called a graphical virtual interactive channel. For example, with a graphical interactive television system, a program listing guide or weather information may be broadcast independently of the other broadcast programs. Because of the flexibility of the system, any form of information may be broadcast.

II. Hardware

Figures 2A, 2B:
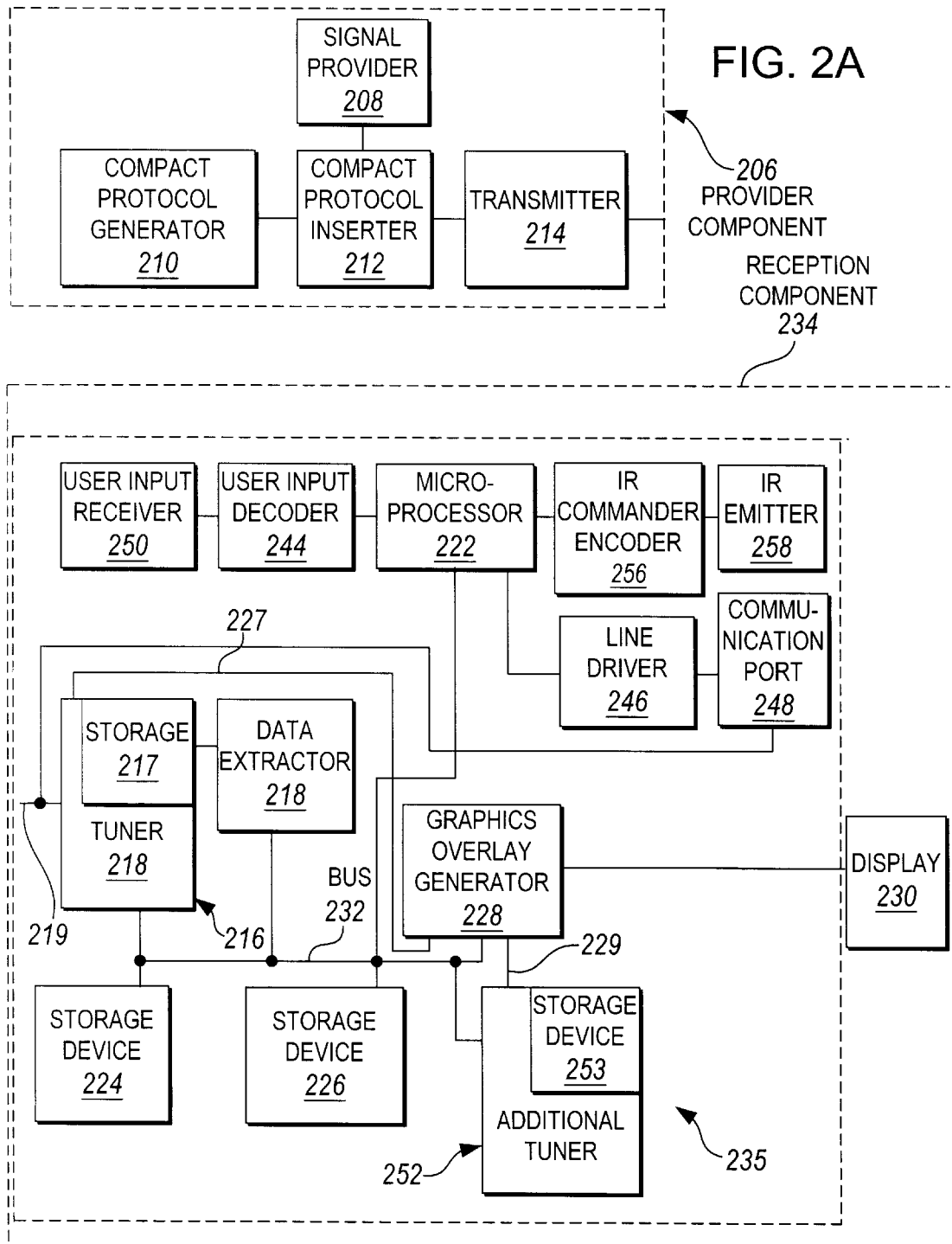
FIG. 2A is a block schematic diagram of a provider component apparatus according to one embodiment of the present invention.
FIG. 2B is a block schematic diagram of a reception component apparatus according to one embodiment of the present invention.

Referring now to FIGS. 2A and 2B, two components, a provider component 206 and a reception component 234, are used to implement a graphical interactive information system in accordance with the present invention. The provider component 206 allows the generation and broadcast of the graphical interactive information system application, and the reception component 234 allows for the reception, decoding, control and display of the graphical interactive information system application. The present invention allows the provider component 206 to define the display and control of a graphical interactive information system application to be displayed on the reception component 234 without requiring the high bandwidth normally associated with interactive information systems which display a graphical user interface. The provider component 206 compresses the graphical interactive information system applications by isolating only the information needed to allow the reception component 234 to produce the graphical user interface and by encapsulating the remainder of the application. Because of this graphical application compression and encapsulation, high bandwidth is not required to broadcast the application. The graphical interactive information system application is broadcast to the reception component 234, which is able to reproduce a complete graphical interactive information application from the small amount of information it receives from the provider component 206 plus its own resident intelligence.

A. Provider Component

The provider component 206 inserts and broadcasts graphical interactive information system applications onto a broadcast signal. In one embodiment, a conventional broadcast signal is provided by signal provider 208. In one embodiment, signal provider 208 is a program generator. In another embodiment, signal provider 208 is a video signal source from a live feed. In another embodiment, signal provider 208 is a video signal from a video storage device, such as a video tape recorder.

The provider component 206 also contains a graphical interactive compact protocol generator and formatter 210. A graphical interactive compact protocol generator and formatter 210 is used by an information provider to generate the interactive information system information to be broadcast. In one embodiment, the graphical interactive compact protocol generator and formatter 210 is a conventional 486 personal computer system with a stored program for operation as described below. The graphical interactive compact protocol generator and formatter 210 generates the compact protocol, described below, in response to commands provided to it by an information provider. In one embodiment, the information provider types in the compact protocol bytes which will represent the graphical user interface as described below. In another embodiment, a visual interface is used to allow a form designer to design forms and immediately see how they will appear. The graphical interactive compact protocol generator and formatter 210 translates and formats the form appearing on the computer screen of the graphical interactive compact protocol generator and formatter 210 into the compact protocol described below. In another embodiment, the graphical interactive compact protocol generator and formatter 210 receives assignment of attribute commands such as form1.border.color=red, and generates the proper compact protocol commands as described below.

A compact protocol inserter 212 inserts the compact protocol from the compact protocol generator 210 into the broadcast medium. The broadcast medium is the frequency spectrum used to carry the compact protocol. In one embodiment, the graphical interactive information system is a graphical interactive television system, the broadcast medium is a standard North American television signal according to NTSC standards, and the vertical blanking interval, or VBI, is used as a transport to broadcast the compact protocol. A transport is the specific portion of the broadcast medium which will carry the compact protocol.

In one embodiment, conventional methods are employed to insert data into the VBI of a conventional broadcast from a broadcast device. The North American Broadcast Teletext Standard EIA-506, OSI layers 1–4, defines the methods and protocols for sending data in one or more lines of the VBI. In one embodiment, the conventional TDS-3 Data Delivery System, available commercially from Norpak of Katana, Ontario, Canada acts as a compact protocol inserter 212 by receiving an RS-232 serial bit stream, buffering the bit stream, and inserting the bits over one or more lines of the VBI.

In one embodiment, error checking or error correcting codes such as Hamming codes are inserted with the data. In one embodiment, the compact protocol inserter 212 translates the data into a Hamming code, and in another embodiment, the compact protocol generator 210 produces Hamming coded data or adds a parity bit.

The compact protocol inserter 212 is coupled to a transmitter 214 which broadcasts the compact protocol described below. In one embodiment, the transmitter 214 is a conventional television broadcast transmitter which receives and broadcasts the signal from conventional VBI inserter 212 which includes the conventional broadcast program and advertisement output signal from program generator 208, and the compact protocol from compact protocol generator and formatter 210. In this fashion, graphical interactive television information may be broadcast on the same frequency with a related television program.

In another embodiment, the transmitter 214 is a conventional cable system head-end amplifier. In another embodiment, the signal provider 208 does not output a television program, and the compact protocol is broadcast without a television program.

In another embodiment, the transmitter 214 is a conventional cellular telephone transmitter. In another embodiment, transmitter 214 is a conventional pager transmitter. These embodiments allow interactive information systems to be used independently of a conventional broadcast such as a television broadcast if desired, allowing the user to access the information from a cellular telephone or cellular equipped personal digital assistant, or even a pager.

A graphical interactive television system need not use the VBI to broadcast a compact protocol for use with a television program, as a wide variety of other transports are available. Some of these transports broadcast the compact protocol separately from the television program, yet retain the ability to coordinate the graphical interactive information with a television program. In this case, transmitter 214 does not broadcast the television program, instead allowing another transmitter to broadcast the program. This allows transmitter 214 to broadcast the compact protocol on any type of frequency. In one embodiment, the transmitter 214 is a conventional out-of-band transmitter which transmits the compact protocol on an unused portion of the television frequency spectrum. In another embodiment, the transmitter 214 is a conventional FM transmitter. Any form of broadcast, wire or cable transmitter may be used to broadcast the compact protocol.

Figure 2C:
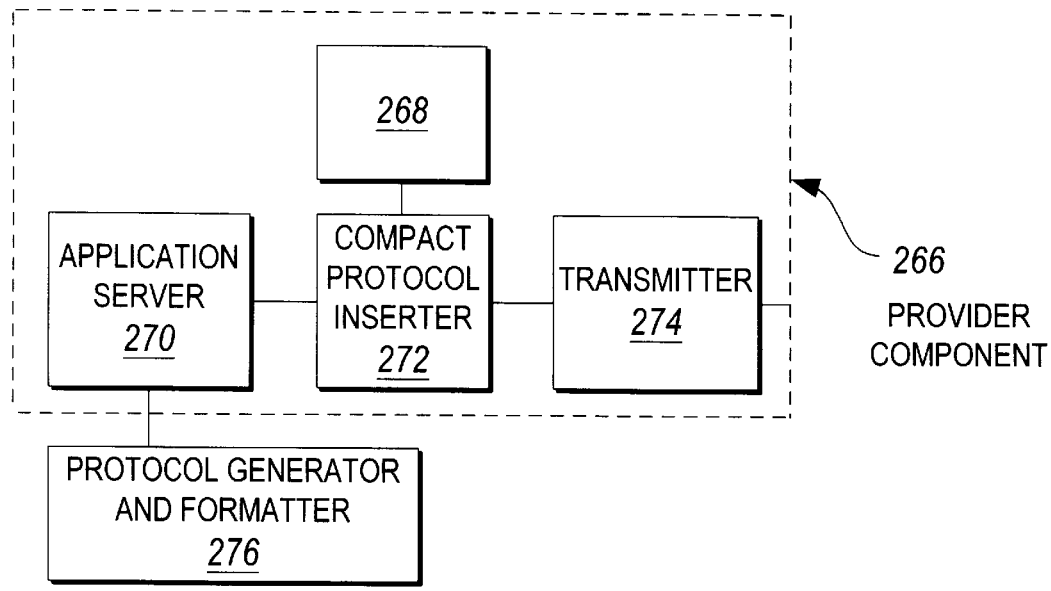
FIG. 2C is a block schematic diagram of a provider component apparatus according to an alternate embodiment of the present invention.

In one embodiment, the developer of an interactive information system application may be a different person or entity from the broadcaster who broadcasts the application. Referring now to FIGS. 2A and 2C, one embodiment of a provider component 266 is shown. Compact protocol generator and formatter 276 is similar to compact protocol generator and formatter 210. However, the compact protocol generator and formatter 276 is not a part of the provider component 266. Instead, another party known as the developer develops the graphical interactive information system applications on the compact protocol generator and formatter 276 and provides them via diskette or modem or other communication device to the information provider.

The information provider loads the graphical interactive information system application from the developer into a graphical interactive information system application server 270. The graphical interactive information system application server 270 sends the graphical interactive information system application to the compact protocol inserter 272, which is similar to compact protocol inserter 212, and controls the operation of the compact protocol inserter 212 to allow, for example, the information provider to control the transport, such as VBI line used to broadcast the graphical interactive information system application. In another embodiment, graphical interactive information system application server 270 also controls the frequency of the application broadcast. Transmitter 274 is similar to transmitter 214.

Figure 2D:
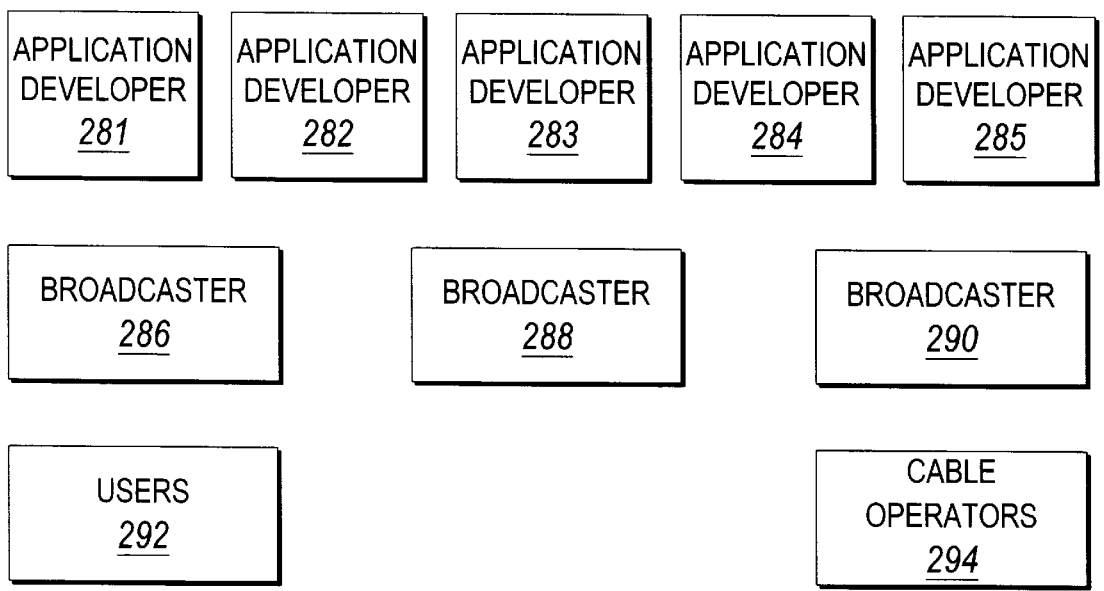
FIG. 2D is a block diagram of developers and information providers according to one embodiment of the present invention.

This arrangement allows for multiple parties to contribute to the graphical interactive information system. Referring now to FIG. 2A, 2B, and 2D, one embodiment of the providers of graphical interactive information is shown. Graphical interactive information system application developers 281, 282, 283, 284, 285 develop applications using compact protocol generators and formatters 276 for one or more broadcasters 286, 288, 290 who broadcast programs, graphical interactive information system applications using provider components 266, or both, to users and cable operators 292, 294, who rebroadcast signals to users from broadcasters 286, 288, 290 and may provide additional applications or broadcaster information using provider components 206 or 266.

Figure 3:
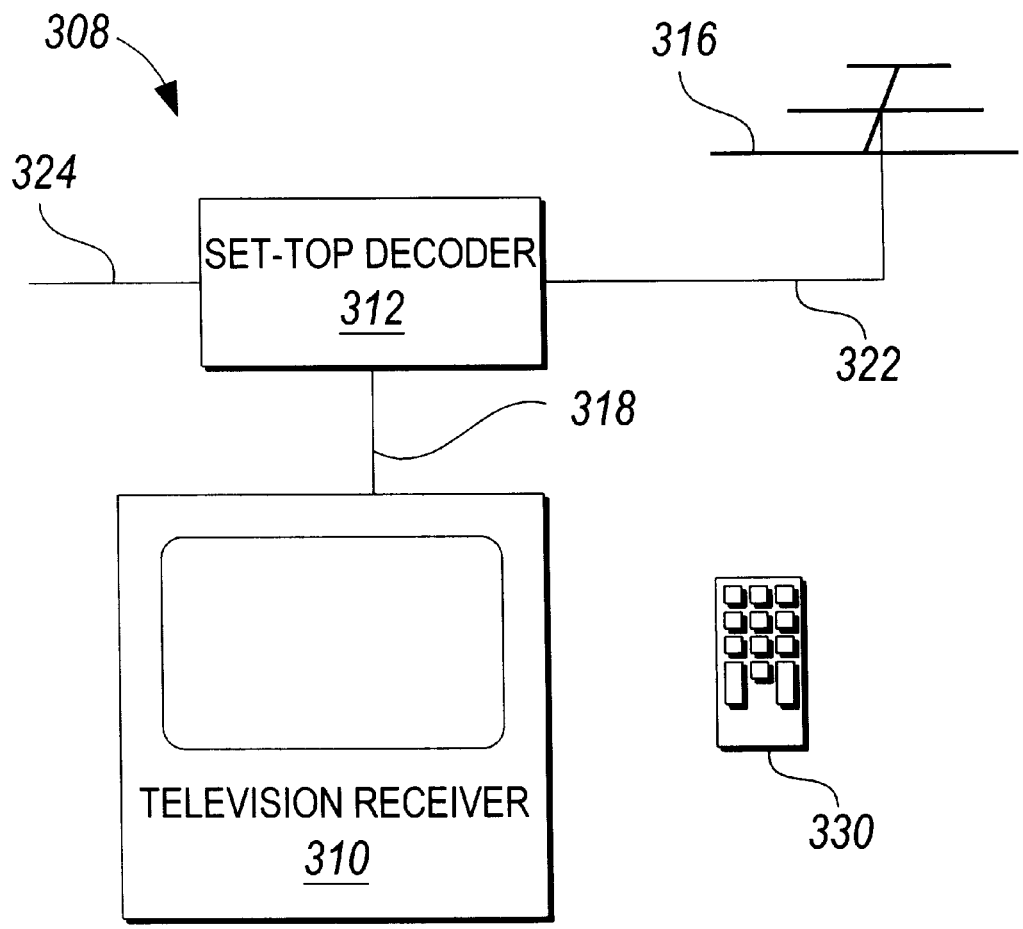
FIG. 3 is a block schematic diagram of user equipment according to one embodiment of the present invention.

B. Reception Component—Graphical Information System Application Display and Control In one embodiment, the reception component 234 is contained in the user reception equipment similar to conventional user reception equipment. Referring now to FIG. 3, one embodiment of the user reception equipment 308 is shown. Conventional television receiver 310 such as a Sony KV32V55 is coupled to a set-top decoder 312 which is coupled via cable 322 to antenna 316. In one embodiment, antenna 316 is replaced by a cable 324 containing a CATV transmission signal. The set-top decoder 312 is similar, but not identical, to a conventional set-top decoder, such as the Jerrold DPV7217/V5B available commercially from General Instrument Corporation of Hatboro, Pa. The internal components of set-top decoder 312 according to the present invention are described below.

Referring again to FIG. 2B the reception component includes a tuner 216 to receive from input 219 and decode a broadcast signal containing the compact protocol. In one embodiment, tuner 216 is a conventional television broadcast tuner. In another embodiment, tuner 216 is a conventional CATV tuner. In another embodiment, tuner 216 is a conventional FM tuner. In another embodiment, tuner 216 is a conventional cellular telephone tuner. In another embodiment, tuner 216 is a conventional pager tuner.

The reception component also includes a data extractor 218 coupled to the tuner 216 to extract the compact protocol from the decoded broadcast signal. In one embodiment, the data extractor 218 is a conventional VBI inband data extraction circuit, such as part number SAA5296 available from Philips Semiconductors of San Jose, Calif. In another embodiment, the data extractor 218 is a conventional modem. Other conventional data extraction equipment and techniques may also be used. In one embodiment, data extractor 218 provides a serial bitstream containing the extracted compact protocol onto bus 232. Bus 232 is coupled to microprocessor 222 which stores via bus 232 the extracted compact protocol information into storage device 226 as instructed by a program stored in storage device 224, and described below. In one embodiment, microprocessor 222 is a conventional 68040 microprocessor available commercially from Motorola, Inc., of Schaumburg, Ill., although any suitable microprocessor may be used. In one embodiment storage device 226 is a conventional addressable RAM memory array.

In one embodiment, the microprocessor 222 uses the error code information from the extracted data to check or correct errors, terminating the application if errors are detected. The microprocessor 222 may decode the data from the error coded data by removing the error code prior to storage in storage device 226.

In one embodiment, storage device 224 is a conventional addressable ROM. In another embodiment, storage device 224 is a conventional flash memory which is readable and writable, yet retains its contents when power is no longer available. Such an embodiment allows any software or data which is resident in the reception component to be modified or changed by broadcasting it using the capabilities of the present invention. For example, a new feature of the reception component could be implemented via broadcast, eliminating the need for the user to replace a part of or all of the reception component to implement the new feature.

As described below, the microprocessor 222 uses the program stored in storage device 224 and the compact protocol information stored in storage device 226 to generate the graphical user interface display information, which is sent from the microprocessor 222 via bus 232 to a graphics display generator 228. In one embodiment, the graphics display generator 228 is a conventional VGA graphics adapter, such as model number ET4000 available from Tseng Labs of Newtown, Pa., coupled to a conventional video genlock processor, such as model GSP500 available from Integrated Circuit Systems of Valley Forge, PA. The graphics display generator 228 is coupled to bus 232 to receive the graphical user interface generated by the graphical interactive information system.

In one embodiment, graphics display generator 228 also receives the broadcast signal corresponding to a broadcast program via line 227 from tuner 216 to allow simultaneous display of the broadcast program and the graphical interactive information system application. In another embodiment, graphics display generator 228 receives a broadcast program signal via line 229 from optional additional tuner 252, and line 227 is not used. This two-tuner 216, 252 approach allows a graphical interactive information application to be displayed simultaneously with a broadcast program without requiring the application to be broadcast on the same frequency as the program.

The display generator 228 is coupled to a display 230. In one embodiment, the display 230 is an LCD display. In another embodiment, the display 230 is a conventional television receiver and the remaining elements 235 of the reception component as later described herein are contained in a set-top decoder.

In one embodiment, the microprocessor 222 is also coupled to a user input decoder 244 coupled to a user input receiver 250 to allow the user to communicate with the microprocessor 222 in order to operate the graphical interactive information system. In one embodiment, the user input decoder 244 is a conventional infrared remote control decoder. The user input receiver is a conventional infrared receiver 250 through which the user may use a conventional handheld remote control device, such as remote control 330 of FIG. 3. Remote control keys pressed by the user translate to coded infrared signals that are received by infrared receiver 250, and are decoded by the user input decoder 244 and sent to the microprocessor 222 to allow the user to communicate with the interactive television system. In one embodiment, the microprocessor 222 responds to certain remote control keys decoded when they relate to choices displayed by the user component 234, but not to other remote control keys, to allow the operation of functions unrelated to the graphical interactive information system application simultaneously with the operation of the graphical interactive information system application using the same user input device.

In another embodiment, the user input receiver 250 is a conventional personal digital assistant keypad device and the user input decoder 244 is a conventional keypad decoder. In another embodiment, the user input receiver 250 is a conventional cellular telephone keypad device and the user input decoder 244 is the keypad decoder. In another embodiment, the user input receiver 250 is a conventional pager switching device and the user input decoder 244 is a conventional switching device decoder.

C. Reception Component—External Device Control

In one embodiment, microprocessor 222 is coupled to a conventional infrared command encoder 256 which accepts an infrared command input and encodes a signal for a conventional infrared emitter 258 to allow the interactive information system to control external devices, such as a VCR.

D. Reception Component—Return Channel

In one embodiment, certain user responses are sent to a response collector for processing. Referring momentarily to FIG. 1, button 118 allows a user to make a selection which will send a $25 campaign contribution to the candidate 114. Referring again to FIG. 2B data line driver 246 accepts data from microprocessor 222 and sends it to communications port 248 to allow the microprocessor to send user responses and other information described below to a response collector who may process the responses. In one embodiment, the data line driver 246 is a conventional modem and communications port 248 is a conventional telephone jack, which allows the reception component 234 to send user responses to a response collector having a receiving modem connected to a conventional telephone line. In another embodiment, the data line driver 246 is a conventional DTMF tone dialer. In another embodiment, the data line driver 246 is a conventional controller for a system of addressable CATV set-top converters such as the ACC-4000 addressable controller available from General Instrument Corporation of Hatboro, Pa., used to provide conventional pay-per-view services. In this embodiment, communications port 248 is coupled to receive the cable TV coax line 219 which is coupled to the tuner 216.

E. Reception Component Tuner Control

In one embodiment, microprocessor 222 is coupled to tuner 216 and optional tuner 252 to allow the microprocessor 222 to communicate with and control the tuned frequency of the tuners 216, 252. This capability can provide such services as channel selection via the interactive information system. One such use of the service would be to allow a user to change channels from a program guide. The user's selection would automatically change the tuned frequency of the tuners 216, 252 to the desired channel.

In one embodiment, tuners 216, 252 contain a broadcaster information table, described below, in a storage device 217, 253 of the tuner 216, 252 identifying the broadcaster corresponding to each tunable channel. This allows the reception component to determine, for example, which channel number corresponds to the Cable News Network, which may be necessary because different cable systems carry Cable News Network on different channels. Storage devices 217, 253 are coupled to the microprocessor 222 to allow the microprocessor 222 to determine which tuner channel number corresponds to a particular station.

In one embodiment, the storage devices 217, 253 are ROMs, installed at the time of manufacture with the channel guide burned in. In another embodiment, storage devices 217, 253 are flash memory to allow the channel guide to be received and extracted from a broadcast signal like the compact protocol as described above, to allow microprocessor 222 to store the broadcaster information table in storage devices 217, 253. In another embodiment, the broadcaster information table is broadcast as a part of the compact protocol described below, the broadcaster information table is stored in storage device 226, and storage devices 217, 253 are not used.

III. Compact Protocol

The compact protocol is used to broadcast a compact set of information and commands from the information provider to the user in an efficient manner, allowing the use of low bandwidth transports such as the VBI.

Figure 4:
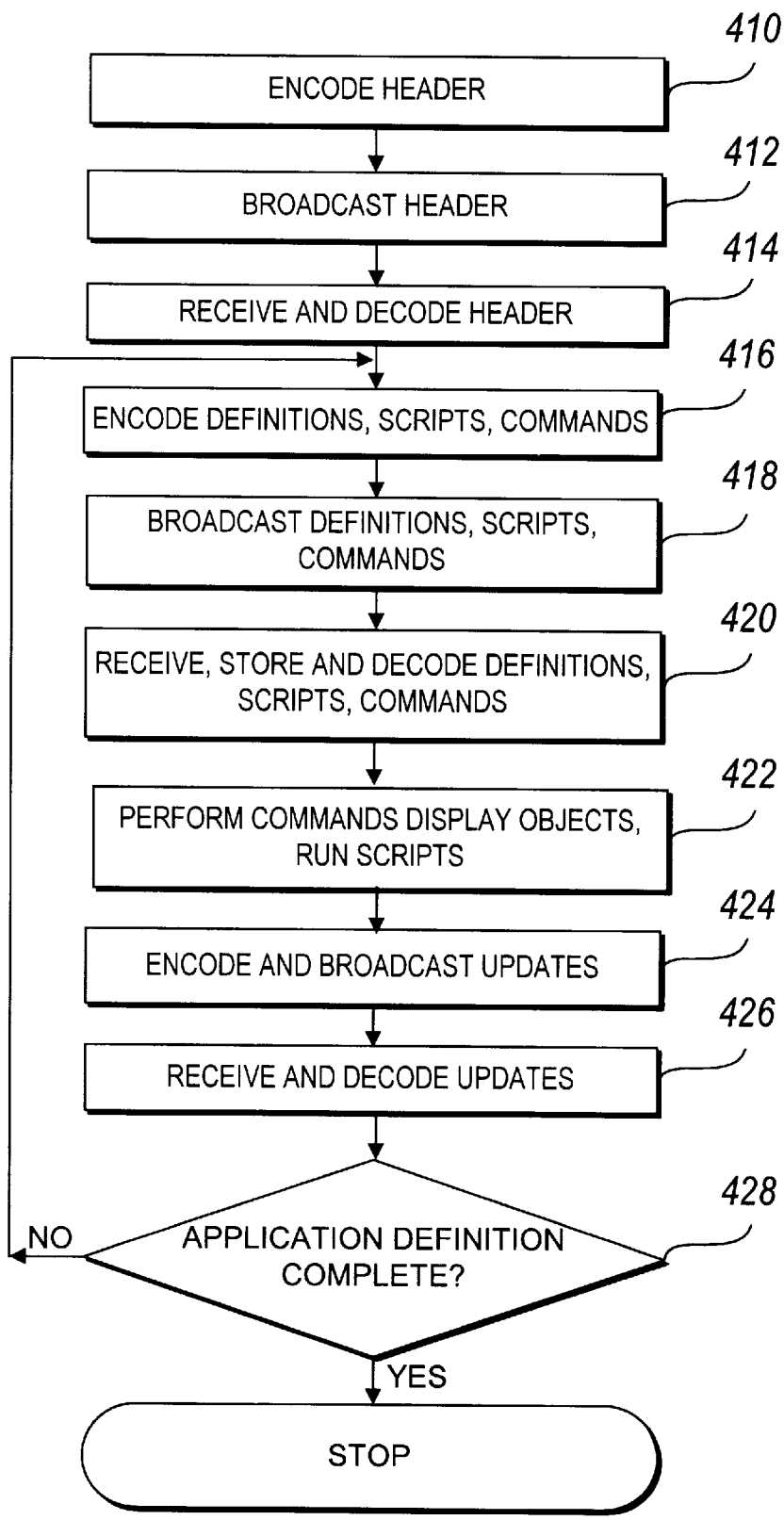
FIG. 4 is a flowchart illustrating a method of one embodiment of the present invention.

Referring now to FIG. 4, one embodiment of a method of sending and operating a graphical interactive information system using the compact protocol is shown. In one embodiment, an application header record is encoded and broadcast to initiate the process and describe the information which follows 410 412. The application header record and the information will define a graphical interactive information system application. One or more desired graphical descriptions such as object or resource definition records and optional scripts or commands, each described below, are encoded and broadcast in any order 416, 418. In one embodiment, the application header record is received and decoded 414 prior to the encoding of definitions, scripts and commands 416, although other embodiments encode, broadcast, receive store and decode the application header record, definitions, scripts and commands in one unit. In one embodiment, no particular order of the steps described above is required as long as the application header definition is broadcast before the broadcast of any definition, script or command in the application. The information broadcast is received and decoded and used by the reception component to display the graphical information and to allow the user to interact with the information broadcast and perform the functions described herein 420, 422. Some or all of the information broadcast may be stored at any time 420.

In one embodiment, a graphical interactive information system application is broadcast again and again, allowing a user to tune to a program at any time yet receive the entire graphical interactive information system application.

Any desired updates as described below may be encoded and sent 424 and received and decoded 426. If there are additional definitions or updates of resources or objects, they may be sent until the application is complete 428, 430. In one embodiment, a termination command described below is broadcast to stop the operation of the application 430.

As described below, a new application may be sent while an original application is in operation or transmission, for example, to allow a new advertisement application to interrupt an original program application, which resumes operation upon termination of the advertisement application. In one embodiment, the new application is also broadcast and operated using the method described above and shown in FIG. 4. A suspend application command is sent by the new or original application in order to suspend the operation of the existing application, and a resume application command may be sent by either application to terminate the new application and resume the operation of the original application. In another embodiment, the new application must send a termination command in order to terminate itself, as a resume application command would only suspend the new application and resume the original application.

Because descriptions of standard graphical objects are transmitted in place of many of the bitmaps or other high-bandwidth display components which would otherwise be required, several advantages are realized. First, a low-bandwidth transport such as the VBI is adequate to allow the display of complex graphics. Second, the system is device-independent. The information provider simply describes the effect desired and each reception component reproduces it as best it can. An effect or image for which display is not allowed or not possible on the reception component can be ignored by that reception component, but displayed on other reception components.

A. Application Header Record

In one embodiment, an application begins with an application header record to identify the information as the start of an interactive application. In one embodiment, if application information is received without an application header, the application may be stored, but may not run.

Figures 5, 6:
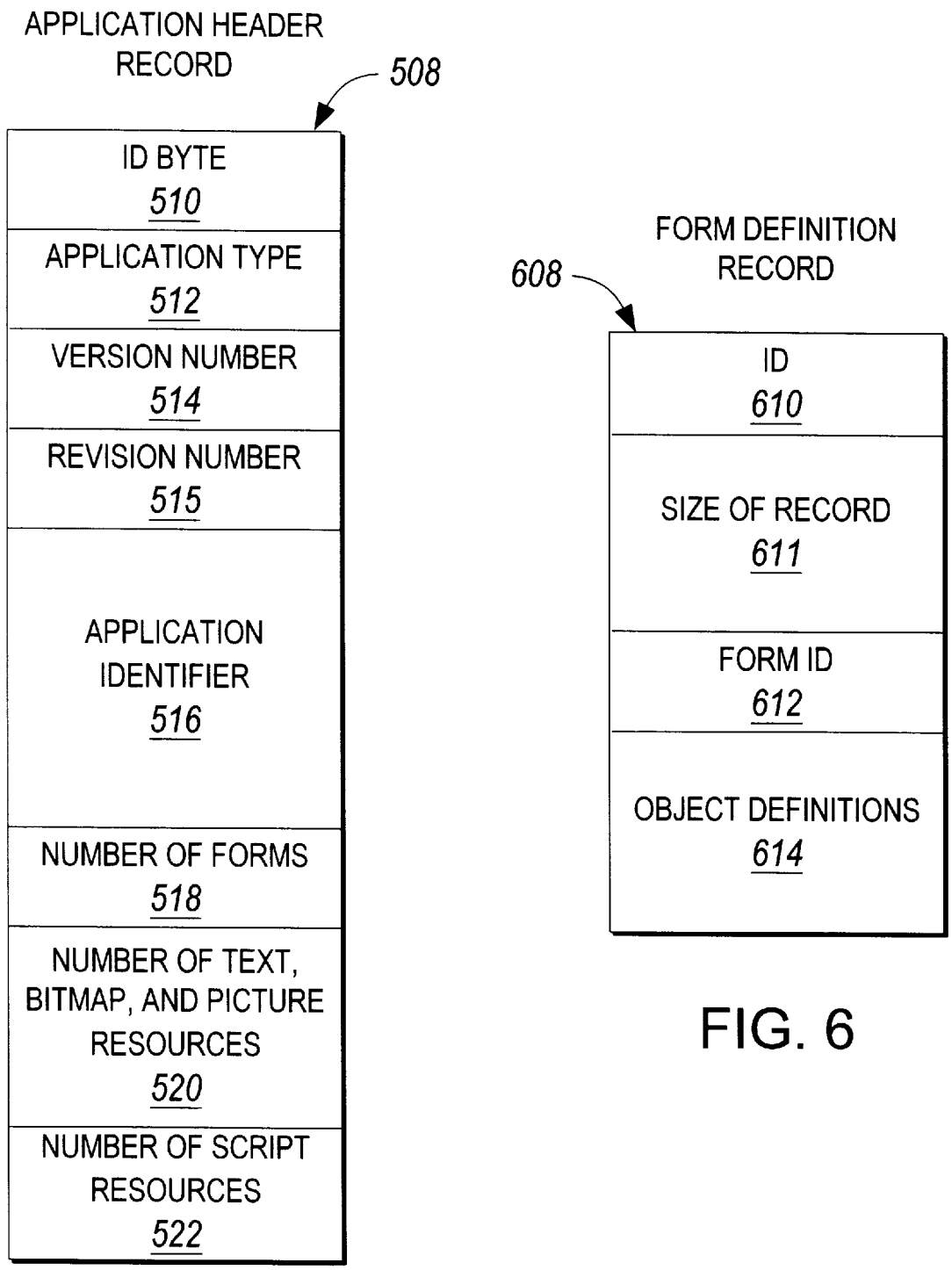
FIG. 5 is a block diagram representing a format of an application header record according to one embodiment of the present invention.
FIG. 6 is a block diagram representing a format of a form definition record according to one embodiment of the present invention.

Referring now to FIG. 5, one embodiment of an application header record 508 is shown. Byte 510 identifies the data as an application header record 508, by having a value equal to 1. Byte 512 describes the application type. Byte 512 having a value equal to 0 signifies a program application such as that described above for use with the politician's speech. Byte 512 equal to 1 signifies an advertisement application.

Byte 512 may have a value equal to 2, signifying a virtual interactive channel. Byte 512 may have other values, indicating other forms of applications.

Referring now to FIGS. 2A, 2B and 5, bytes 514, 515 contain the version and revision number, respectively, of the protocol used to communicate between the provider component 206 and the reception component 234 as described below. The receipt of version and revision numbers by a reception component 234 allows the reception component 234 to respond to protocols which are generated by different versions or revisions of the protocol generator 210. In one embodiment, the reception component 234 disregards a protocol which specifies a version number of which the reception component 234 is unaware or incompatible.

Referring again to FIG. 5, long word 516 is an application identifier, a unique identifier which identifies the application. This information may be sent to a response collector to identify the information provider and application which generated the response. In one embodiment, a long word is four bytes in length, although other lengths may also be used.

Bytes 518, 522, and word 520 assist the microprocessor in its memory management function described below by identifying many of the memory requirements in advance. In one embodiment, a word is two bytes in length, although other lengths may also be used. Byte 518 contains the number of forms in the application, byte 522 identifies the total number of script resources, and word 520 identifies the total number of text, bitmap and picture resources defined by the application. These terms and their operation are described below.

In one embodiment, bytes of all records are broadcast in the order shown in the FIGS. 5, 6, 7B, 8, 9, 10, 11, 12, 13, 14A, 14B, 14C, 14D, 14E, 15, 16, 17A, 17B and 22.

B. Graphical Object Definitions

The compact protocol allows the broadcast of graphical interactive information by the use of a set of graphical object definitions. Graphical object definitions describe characteristics of graphical objects, such as size of the object, color of the object, location on the display, and other characteristics of the graphical object. Graphical objects include the form object, buttons on the form, bitmaps, pictures, lists, as well as non-graphical objects such as timers. In one embodiment, a text object contains descriptive information such as font and color about a text string, as well as the location of the text string, but does not contain the text string itself. Text strings are resources, and are separate from a text object which describes them.

1. Form Definition Record

Each application may contain one or more forms. A form is a collection of objects which are defined as a single unit by the information provider using a form definition record.

Objects in a form which are capable of being displayed are displayed together.

Referring now to FIG. 6, one embodiment of a form definition record 608 is shown. Byte 610 has a value of 2 to identify the record as the start of a form definition. Word 611 is the size, in bytes, of the form definition record. Byte 612 is an identifier assigned by the information provider to identify the form defined by the form definition record 608. In one embodiment, a second form having the same form number as one already defined in an application is ignored. Block 614 contains one or more object definitions for the form as described below.

Referring now to FIGS. 2B and 6, in one embodiment, after microprocessor 222 receives a form definition record 608, the microprocessor 222 under control of a program stored in storage device 224 allocates an area of the storage device 226 for the form, the objects on the form, resources required by the form and application control information to allow the user to interact with the form. Microprocessor 222 generates and stores several tables in storage device 226 as described below.

3. Object Definitions

Several standard objects may be defined using compact object definitions, which allow the user to specify the look of graphical objects by transmitting an object identifier as the first byte of the object, and only a few parameters.

a. Form Object

One type of object is a form object. A form object defines a rectangular region of the screen and the appearance of the region. The information provider defines form objects using a form object definition record.

Referring now to FIG. 7A, one embodiment of a form object 700 having a border 706 and an interior 702 is shown displayed on a screen 703 of a conventional television set 704.

The form object may be transparent, in which case the other objects in the form appear to float over the display. If the display is a television screen, and the application is not a graphical interactive virtual channel, a transparent form object can cause the other objects in the form to appear to float over the broadcast picture. Otherwise, the form object covers all or a part of the broadcast picture and the objects may cover all, a part, or none of the form.

Referring now to FIGS. 7A and 7B, one embodiment of a form object definition record 708 is shown. Byte 710 identifies the object as a form by having a value of 000001 in the least significant six bits. Bytes 712, 714, 716, 718 contain the position of the left side, top, right side and bottom of the form 700, respectively, relative to the center 701 of the screen 703 using a coarse coordinate system. A coarse coordinate system is a representation of a unit of width and height. In one embodiment, the unit of width and height is selected to allow representation of the entire width or height of the display in a single byte of 256 unique numbers. In one embodiment, the display is a North American television signal television screen according to NTSC standards having a width of 160 color clock widths, each color clock width being the width covered by the electron beam in 280 nanoseconds, and a height of 400 interlaced scan lines. In one embodiment, coarse coordinate units equal one color clock in width and two scan lines in height. In one embodiment, the center 701 of the screen 703 is represented as coarse coordinates 128, 128.

Byte 719 contains a description code for the style of the border 706 of form 700. In one embodiment, valid description codes are 0 for no border, 1 for a thin line border, 2 for a thick line border, 3 for a gothic style border, and 4 for a border having a "wavy" appearance, though other embodiments could use other codes or styles. Byte 720 contains a color code for the color of the border 706. Byte 721 contains a color code for the color of the interior 702 of the form 700.

Byte 722 and word 724 are used to locate the script, described below, for the form. Byte 722 is an index into a script handle table for the location of the first byte of a script resource containing the script to execute. A script handle table is a table of pointers to the script resources for the application. A script resource is a block of memory which may contain numerous scripts. In one embodiment, a script resource may not exceed 64K bytes in size. Word 724 contains the offset from the first memory location of the script resource to the initialization script.

If the most significant bit of byte 710 is set, block 730 contains optional hint information regarding the appearance of the form, such as textured appearance or transition effects such as fade in and fade out. Hints for one embodiment are listed in Appendix A. If the capabilities of the user's interactive system cannot accommodate the appearance or effects indicated by the hints, the interactive system may ignore the information or display it as closely as possible. If the most significant bit of byte 710 is cleared, block 730 contains no bytes and is not used.

b. Button Objects

Another object is the button object. Referring now to FIG. 1, buttons 118, 124 are selected by the user in order to interact with the graphical interactive information system. A button is defined by the information provider using a button object definition record.

Referring now to FIG. 8, one embodiment of a button object definition record 808 is shown. Byte 810 has a value of 2 to identify the definition as a button object. Bytes 811, 812, 813, 814 identify the positions of the left edge, top edge, right edge, and bottom edge of the button as a distance from the upper left hand corner of the form in coarse coordinate units.

Word 816 contains a resource number corresponding to a text, bitmap or picture resource to use for the button. Numbers on the button are inserted automatically on this image based upon the location of the button on the form. Optional byte 817 contains text color information, and optional word 818 contains bits corresponding to the font, size and style of the text if the resource is a text resource, indicated by setting the second most significant bit in Byte 817. Resources are described below. In one embodiment, the text size measurement is in 1/500th of a display screen height.

Byte 820 contains an index into the script handle table to the pointer for the script resource containing the script to execute when the user selects the button. Word 822 contains an offset from the start of the script resource to the script to be executed when the user selects the button.

The most significant bit of byte 810 is set if hint information exists in block 828. A hint is a description of how an object can appear on certain systems capable of displaying such an appearance. Where the reception component is not capable of such a display, the hint may be ignored, or the reception component may provide an appearance matching the desired appearance as closely as possible. Numbers are assigned to buttons and displayed by the reception component, but these assignments may be overridden using hints. Other hints for one embodiment are listed in Appendix A. Optional block 828 contains one or more bytes of the hint data if the most significant bit of byte 810 is set, and block 828 contains no bytes otherwise.

c. Text Objects

Text object descriptions are provided by the information provider to describe the location and appearance of text, but do not contain any of the actual text itself. The text itself is a resource, described below.

Referring now to FIG. 9, one embodiment of a text object definition record 908 is shown. Byte 910 contains an object type identifier having a value of 3 to indicate the object is a text object. Bytes 912, 914, 916, 918 describe the left edge, top edge, right edge and bottom edge, respectively, in coarse coordinate units from the upper left corner of the form object, of a box into which the text resource may be placed by the reception component. Byte 920 contains a code for the color of the text. Byte 922 contains text alignment information. Word 924 contains the resource handle of the text string which the reception component is to display in the box.

Word 926 defines the font, size and style to use to display the resource. The font makes up the first four bits, the size makes up the next six bits and the style makes up the remaining six bits of word 926.

Block 932 contains optional hint flags, size and data similar to the hints described above and shown in FIG. 8.

d. Bitmap Objects

A bitmap object is used to display a bitmap resource, described below, on the form. An information provider defines a bitmap object using a bitmap object definition record.

Referring now to FIG. 10, one embodiment of a bitmap object definition record 1008 is shown. The least significant six bits of byte 1010 contain an object type identifier having a value of 4 to indicate the object is a bitmap object. Bytes 1012, 1014, 1016, 1018 define the left edge, top edge, right edge and bottom edge, respectively, in coarse coordinate units from the upper left corner of the form object, of a box into which the bitmap may be placed.

Word 1022 contains a handle to the resource containing the bitmap. Block 1032 provides hints as described above and shown in FIG. 8.

e. List Objects

A list object provides the user with a list of options and allows for a selection of one or more options. An information provider defines a list object using a list object definition record.

Referring now to FIG. 11, one embodiment of a list object definition record 1108 is shown. The least significant six bits of byte 1110 contain an object type identifier having a value of 5 to indicate the object is a list object. Bytes 1111, 1112, 1113, 1114 define the left edge, top edge, right edge and bottom edge, respectively, in coarse coordinate units from the upper left corner of the form object, of a box into which the list may be displayed.

If the second most significant bit of byte 1110 is set, then word 1116 holds font, size and style information similar to word 926 of FIG. 9 and Byte 1117 holds the color code of the list, otherwise word 1116 and byte 1117 are unused. Byte 1118 holds the number of entries in the list, and byte 1120 allows a default selection to be specified using the order of the entries in block 1122 beginning with entry 0. In one embodiment, the default selection is initially highlighted to indicate which entry will be selected by the user if the user selects a button marked "yes" as instructed by the scripting commands described below. Block 1122 contains one or more words containing the resource handle, described below, of the each entry in the list.

Optional block 1128 provide optional hint data as described above and shown in FIG. 8. In one embodiment, the reception component displays the resources along with a number it assigns to each resource to accommodate selection by the user, unless overridden by hints. In another embodiment, user responses, such as specific remote control keys, are assigned to move a cursor up or down the items in the list.

f. Timer Objects

Timer objects allow the graphical interactive information system application to use timed events, such as a timed response to a question in a game. An information provider defines the timer object using a timer object definition record.

Referring now to FIG. 12, one embodiment of a timer object definition record 1208 is shown. The least significant six bits of byte 1210 contain an object type identifier having a value of 6 to indicate the object is a timer object. The second most significant bit of byte 1210 is a flag indicating if the timer operates one time, or restarts again after each period has elapsed. Word 1212 contains a value equal to the period of the timer in 1/60ths of a second. Byte 1214 contains the script handle of the script resource containing the script to execute at the end of the period indicated as described above. Word 1216 contains an offset from the start of the script resource specified as described above to the script to execute when the period has elapsed from the time the object is received or the last period ended.

g. Picture Objects

A picture object allows an information provider to define a picture using a picture resource, which is a list of several bitmaps, text resources and drawing primitive functions, which can allow the picture resource definition to be more compact than an equivalent single bitmap resource. An information provider defines a picture object using a picture object definition record. Referring now to FIG. 13, one embodiment of a picture object definition record 1308 is shown. Byte 1310 contains an object type identifier having a value of 7 to indicate the object is a picture object. Bytes 1312, 1314, 1316, 1318 define the left edge, top edge, right edge and bottom edge, respectively, in coarse coordinate units from the upper left corner of the form object, of a box into which the picture resource may be placed.

Word 1322 contains the handle of a picture resource, described below, to display in the box. Block 1328 provide hints as described above and shown in FIG. 8.

C. Resource Definitions

Unlike object definitions which define the appearance of an object, resources represent data which can be displayed. The compact protocol also allows the information provider to define certain resources, such a bitmaps, to provide the pictures or icons 120, 122 shown in FIG. 1. Text is also provided through the use of resources. Some resources are predefined, and others may be defined by the information provider. An information provider defines resources using resources definition records.

Referring now to FIG. 14A, one embodiment of a resource definition record 1408 is shown. Byte 1410 identifies the record as a resource definition record by having a value equal to 2. Word 1411 contains a value equal to the number of bytes in the resource definition record. Word 1412 is the resource handle of the resource.

In one embodiment, four types of resources may be defined in block 1414, a text resource, a bitmap resource, a picture resource and a bitmap resource list. The stored program in the storage device of the reception component will interpret the resource and format it according to the capabilities of the reception component so that it may be rendered as closely as possible to the definition. If necessary, the stored program may discard a resource definition data that it cannot use, for example, because the resource has a higher resolution than the reception component is capable of rendering as described below.

1. Text Resources

A text resource contains text data. Referring now to FIG. 14B, one embodiment of a text resource 1428 is shown. Byte 1430 having a value equal to 1 identifies the resource as type text, and block 1432 contains a null terminated text string, such as ASCIIZ.

2. Bitmap Resources

A bitmap resource is used to hold bitmaps. Bitmaps are described in Kliewer, *EGA/VGA Programmer's Reference Guide* (2nd. ed., McGraw Hill 1990). Referring now to FIG. 14C, one embodiment of a bitmap resource 1438 is shown. Byte 1440 having a value equal to 2 identifies the resource as type bitmap. In one embodiment, the resolution of the bitmap is higher than the coarse coordinate system, allowing the utilization of the full display resolution of the reception component. Bytes 1441, 1442, 1443, 1444 define four colors for use as described below. Word 1446 defines the width in pixels of the bitmap and word 1448 defines the height of the bitmap in pixels. Block 1450 contains one or more bytes of the bitmap data, each byte in block 1450 containing four pairs of bits, each pair representing one of the four colors defined above, of a pixel. Each pixel is drawn to the right of the pixel before until the pixel width 1446 is reached, at which point the next pixel is drawn at the left boundary of the next row and the process repeats until all the pixels are drawn.

Any form of bitmap or similar format may be used. For example, bitmaps using a byte per pixel, where each byte represents the color of a pixel, may be used.

In one embodiment, the bitmap data is compressed using such compression techniques as conventional run-length encoding.

3. Picture Resources

Picture resources are used to hold zero or more graphical elements such as text strings, bitmaps, and primitive drawing functions, as well as relative position information. Referring now to FIG. 14D, one embodiment of a picture resource 1458 is shown. Byte 1460 having a value equal to 32 identifies the resource as type picture. Word 1462 contains the number of bytes in the picture resource definition record. Block 1464 contains zero or more picture resource elements described below.

Referring now to FIG. 14E, one embodiment of a picture resource element is shown. The least significant six bits in byte 1470 indicate the type of the element. Element types include text or bitmap resources, as well as drawing functions such as ellipse, circle, horizontal line or vertical line. The type codes are listed for one embodiment are: text=24, bitmap=32, point drawing function=1, horizontal line drawing function=2, vertical line drawing function=3, rectangle drawing function=4, filled rectangle drawing function=5, diagonal line drawing function=6, ellipse drawing function=7, circle drawing function=8, and spline drawing function=9. The most significant bit of byte 1470 indicates the last element in the picture resource, allowing multiple elements to be a part of a picture resource. Bytes 1472, 1474 contain the x and y coarse coordinate relative to the center of the screen of the upper left corner of the element, and bytes 1476, 1478 contain the x and y coarse coordinates relative to the center of the screen of the lower right corner of the element, except for the horizontal line drawing function, which does not contain byte 1478, the vertical line drawing function, which does not contain byte 1476, and the point drawing function and bitmaps which do not contain bytes 1476 or 1478 because in each case, the omitted byte or bytes are unnecessary. Byte 1480 contains the color code for the element, unless the element type is bitmap. Word 1482 contains a resource handle if the type is text or bitmap, otherwise, word 1482 is unused. Block 1484 contains additional information if the type is text, similar to word 926 of FIG. 9.

4. Resource Lists

Resource lists contain one or more bitmap resources. Referring now to FIG. 14F, one embodiment of a resource list 1488 is shown. Byte 1490 contains a unique value to identify the resource as type resource list. Block 1492 contains one or more resource list elements. Referring now to FIG. 14G, one embodiment of a resource list element 1498 is shown. Word 1497 contains an offset to the byte following the resource list element, or zero if resource list element 1498 is the last element in the list. Block 1499 contains a bitmap resource described above and shown in FIG. 14C.

D. Indexing Definitions

Referring now to FIG. 2B, in one embodiment, microprocessor 222 performs several memory management functions. Microprocessor 222 maintains in storage device 226 a pointer to each form in an application using a form handle table. The form handle table contains a pointer to the first byte of each form object in the application. The objects in each form are stored as a linked list, with the form object pointing to the first object in the linked list. An object is located by using the form handle table to locate the form, and then traversing the linked list until the desired object is located. In one embodiment, objects may be referenced by type and position in the list. For example, button 3 is the third button found while traversing the list. In another embodiment, all objects are sequentially numbered in the list, and objects are referred to by this object number.

The location of each resource is stored using a resource handle table in which each entry in the table contains a pointer to the resource. The resource is located by using a resource handle index to locate the pointer in the resource handle table, and using the pointer to locate the resource.

Because several applications may be resident in the storage device 226 at one time, more than one set of the tables and lists described above may be maintained by microprocessor 222, allowing a program application to stay resident while an advertisement application is operating, so that the program application need not be reloaded after the end of the advertisement when the program resumes. The program application or advertisement application may be suspended or terminated by an advertisement application. In one embodiment, more than one advertisement application may be resident in storage device 226 to allow a user to send a response to one advertisement application after the advertisement terminates, yet still receive the application for the following advertisement. In one embodiment, only the form or forms of the application related to the response will remain in storage device 226 after microprocessor 222 receives a second advertisement application.

In one embodiment, a program application is allocated a larger percentage of memory than an advertisement application due to the longer running time of the program application. In one embodiment, a program application may occupy 75% of the available memory as described below, leaving 25% for one or more advertisement applications. A virtual interactive channel application may occupy 100% of the available application memory.

In one embodiment, memory is allocated by limiting the number of available handles in the application's handle table based upon the type of application as described above. Although this embodiment does not strictly enforce the actual memory usage of the application, it provides a reasonable level of protection without a significant increase in complexity of memory management. In this embodiment, the number of handles to be allocated may be based upon experience of the average size of the memory required as a result of each entry in the handle table. In one embodiment, the average size per entry is 50 bytes.

In another embodiment, memory itself is allocated by tracking the amount of memory a graphical interactive information system application uses as the memory is reserved, and terminating the application if the application's memory allocation is exceeded.

E. Updates

The compact protocol also allows the information provider to update information used by previous definitions so that the appearance of a form can be modified quickly without resending a large amount of data required to resend the entire application or form. An information provider sends an update record to replace a form, one or more objects on a form, or one or more resource definitions in an application.

Figure 15:
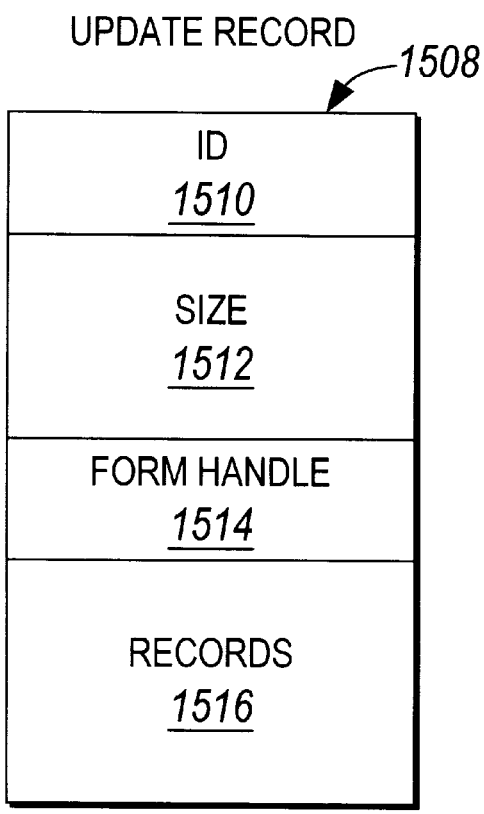
FIG. 15 is a block diagram representing a format of an update record according to one embodiment of the present invention.

Referring now to FIG. 15, one embodiment of an update record 1508 is shown. Byte 1510 having unique values to identify the record as an update record to update a form, one or more objects on a form, or one or more resources, respectively. Word 1512 identifies the size in bytes of the record. Block 1514 is the handle of a form to replace, the form containing the objects to replace or the resource to replace. Block 1516 contains a form object definition record, one or more button, text, bitmap, picture, timer or list object definition records, or text or bitmap resource definition records described above to replace the object or resource indicated in byte 1514.

In one embodiment, entire forms are updated by storing the objects of the form and adjusting the handle to the old form to point to the new form. One or more objects in a form may be updated by storing the new object and then inserting the new object in the linked list making up the form in place of the old object. A resource is updated by storing the new resource and adjusting the resource handle table to point to the new resource.

F. Instructions

The compact protocol also allows the information provider to send instructions to the reception component to control the operation of the interactive information system.

A form may be displayed using a two byte command. The first byte has a value equal to 5 to indicate the command is a form display command, and the second byte contains the form number. The form display command allows the information provider to display a form without any input from the user.

A program application may be suspended or resumed by an advertisement application or virtual channel using the single byte commands suspend and resume, having a value of 6 and 7, respectively. An application may be permanently terminated by sending a single byte command having a value equal to 8.

G. Interactive Icon Definition

In one embodiment, an interactive icon is shown on the display to indicate an interactive application has been received by the reception component. The user can then press one or more keys on the remote control to display the first form of the application. The information provider may control the icon displayed by sending an interactive icon definition record.

Figure 16:
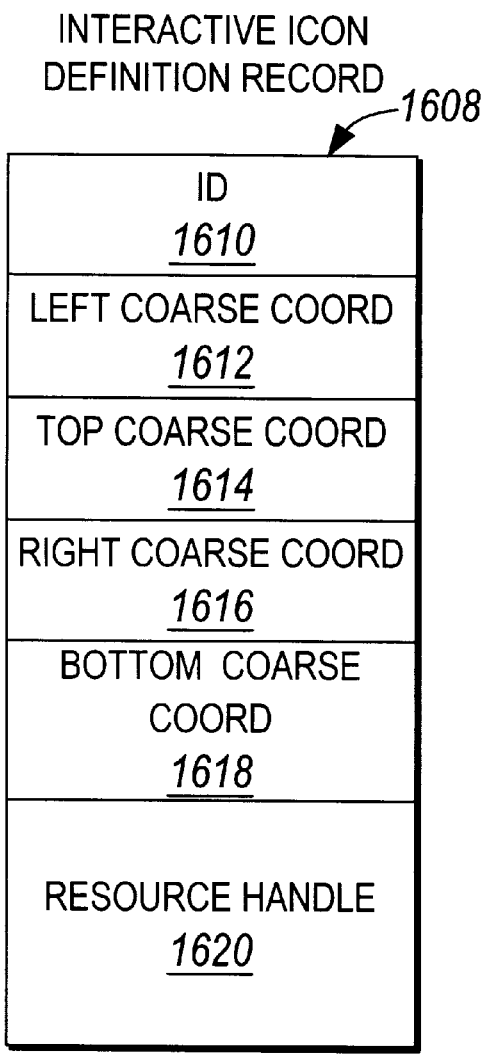
FIG. 16 is a block diagram representing a format of an interactive icon definition record according to one embodiment of the present invention.

Referring now to FIG. 16, one embodiment of an interactive icon definition record 1608 is shown. Byte 1610 contains a value of 9 to identify the record is an interactive icon definition record. Bytes 1612, 1614, 1616, 1618 define the distance in coarse coordinate units from the center of the screen of the left edge, top edge, right edge and bottom edge, respectively, of a box in which the interactive icon will be displayed. The upper left edge of the icon is placed at the upper left edge of the box defined. Word 1620 is the resource handle of the resource to be displayed as the icon.

H. Scripts

Scripts are a sequence of one or more scripting commands provided by an information provider. A script may be executed when received, or may be executed in response to an action.

Figure 17A:
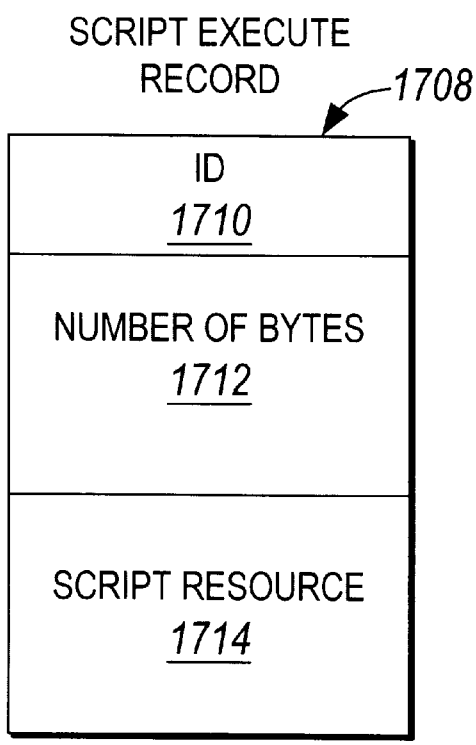
FIG. 17A is a block diagram representing a format of a script execute record according to one embodiment of the present invention.

In one embodiment, the compact protocol allows an information provider to send a script which is executed upon receipt and then discarded. An information provider defines the script to execute using a script execute record. Referring now to FIG. 17A, one embodiment of a script execute record 1708 is shown. Byte 1710 having a unique value to identify the record as a script execute record. Word 1712 contains the number of bytes in the script execute record. Block 1714 contains the script resource, containing one or more codes as described in Appendix B.

The compact protocol also allows the information provider to provide scripts defining the operation of the system in response to user selections or other events. Four objects may have scripts associated with them: forms, lists, buttons, and timers. The form object script is executed when the form is displayed. A list object script is executed when the user indicates a selection. A button object script is executed when the user selects the button. A timer object script is executed at the end of the timer period.

A script can display or hide a form or an object on the form, modify an object's characteristics, such as color or size, or modify which resource an object will use. A script can also declare variables unique to the script and change the values of those variables. A script can use standard logic functions, such as "or", "and", "if . . . then", etc. In one embodiment, the script can perform all the math and logic functions of a conventional basic interpreter.

Figure 17B:
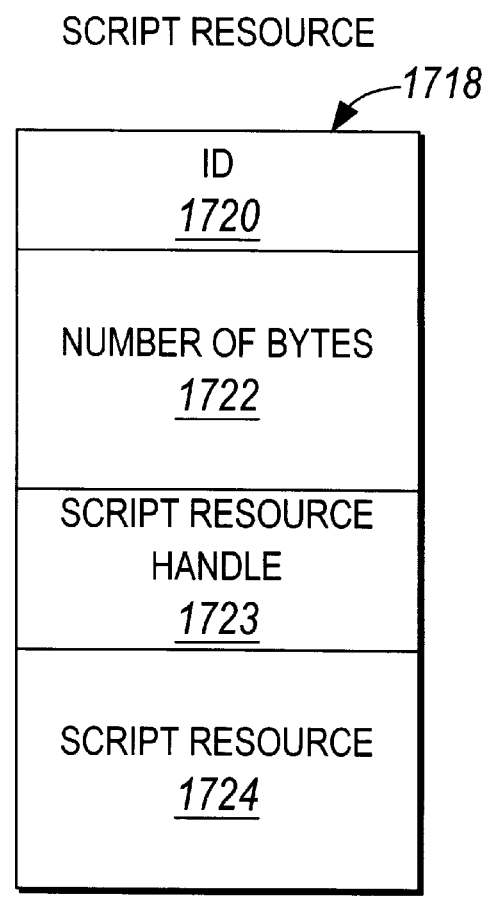
FIG. 17B is a block diagram representing a format of a script resource according to one embodiment of the present invention.

Referring now to FIG. 17B, one embodiment of a script resource 1718 is shown. Byte 1720 having a unique value to identify the resource as a script resource. Word 1722 contains the number of bytes in the script resource. Byte 1723 contains the handle used as an identifier of the script resource. Block 1724 contains the script resource, containing one or more codes as described in Appendix B.

Responses are scripted as well, including the formatting of a response byte or byte containing product information, quantity, or the like. In one embodiment, a script may contain one or more of four unique scripting commands which generate responses.

An "order" scripting command allows a user to use the interactive information system to order a product or service from a vendor. An order scripting command contains a one-byte code representing the command, one word of cost information and a one byte variable indicator to allow the information provider to indicate a variable to return as described below. The cost information may be used by the reception component 234 of FIG. 2B to check the price of the order to verify that it does not exceed a user's predefined limit to assist the user for budgeting purposes. The variable indicator is a code to indicate a variable to return as described below. The variable may be built by the information provider using the scripting language, and in one embodiment, the variable is four bytes in length.

A "request" scripting command allows a user to request information for no charge. A request scripting command is similar to the order scripting command, but, no cost information byte is passed to the reception component for verification.

Two scripting commands are used which generate anonymous responses described below. A "respond" command has a format similar to the request scripting command, to allow the generation of a four byte response to be defined by the information provider using the scripting language. A "vote" scripting command is a single byte command which generates a response having only one byte which contain predefined codes for "yes", "no", "abstain" and "don't know," to allow for simple, compact response generation.

Referring now to FIG. 2A, scripts are defined by the information provider using the compact protocol generator 210. In one embodiment, the compact protocol generator 210 has a user interface allowing characteristics of objects to be defined or modified or other actions to be taken using an object oriented format, such as "form1.show" to display the first form. Other commands such as assignment of variables and logic functions are defined using a set of commands similar to the BASIC programming language.

The protocol generator converts the BASIC-like commands to one or more numeric codes, and includes the codes in the application broadcast. One embodiment uses the codes described in Appendix B.

In one embodiment, scripts are stored in a script resource, which is an area of memory up to 64K bytes long which stores one or more scripts. A script handle table keeps track of all script resources by storing the memory location of the first byte of each script resource. The precise location of the start of each script is provided to the system as an index into the script handle table, and an offset from the location pointed to by the script handle table entry corresponding to the index.

Scripts are executed using a command interpreter which performs the functions indicated until it reaches an end of script identifier. In one embodiment, the script instructions are interpreted directly from the codes which make up the script resource, and in another embodiment, script instructions are first converted into C++ code prior to interpreting them.

IV. Broadcaster Information

Referring now to FIGS. 2A, 2B, 2C and 18C, in one embodiment, an information provider such as a cable television operator uses the provider component 266 to create, insert and broadcast broadcaster information as a graphical interactive information system application for reception and decoding by a reception component 234.

In one embodiment, the information provider provides broadcaster information to allow a reception component 234 to build a broadcaster information table. A broadcaster information table organizes some or all broadcaster information to allow the reception component 234 to locate the tuned frequency or other identifier of a broadcaster or an application.

Broadcaster information may reach the information provider in a variety of ways. Broadcasters or other information providers may send broadcaster information relating to their broadcasts to the information provider. For example, the transport a broadcaster uses to broadcast graphical interactive information system applications, such as VBI line 14, and the broadcaster's network identifier, such as CNN, may be provided by the broadcaster to the information provider who will provide broadcaster information. The broadcaster can also identify whether it provides programs, interactivity or both, and any interactive information system protocols it uses. Thus, a broadcaster may be an information provider for interactive information system applications it broadcasts, and provide content to another information provider, the cable operator, who broadcasts the broadcaster information via its own provider component 206.

The information provider who will broadcast the broadcaster information can assemble information received by others, provide its own broadcaster information or both. For example, the cable operator can provide the channel guide containing a frequency identifier such as the frequency or channel number and call letters for each of the broadcasters on the cable system in addition to information it receives from broadcasters or other parties.

In one embodiment, an information provider broadcasts a broadcaster information table by broadcasting broadcaster information such as broadcast channels available to the user, the broadcast frequency corresponding to the channel, call letters corresponding to a broadcaster on the channel, network identifiers for the broadcasters, or interactive information protocol or location information for a broadcast or an application 1810, whether a broadcaster broadcasts programs, graphical interactive information system applications or both 1811, a broadcast program tuned frequency location identifier 1812, and interactive information system application tuned frequency identifiers 1814 for the broadcaster or for particular applications broadcast by the broadcaster or others.

Figures 18A, 18B, 18C:
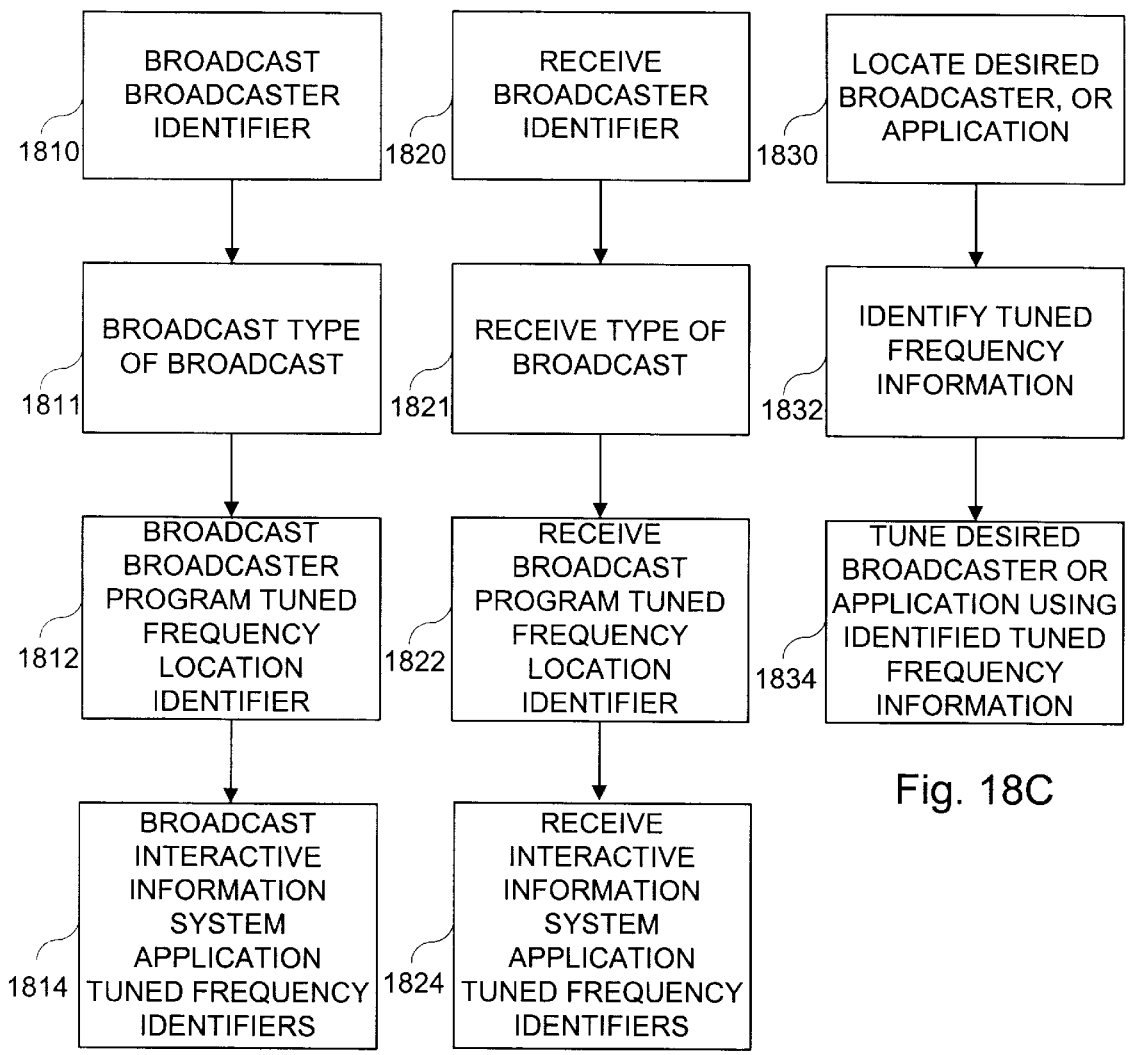
FIG. 18A is a flowchart illustrating a method of broadcasting a broadcaster information table according to the present invention.
FIG. 18B is a flowchart illustrating a method of Receiving a broadcaster information table according to the present invention.
FIG. 18C is a flowchart illustrating a method of using a broadcaster information table according to the present invention.

Referring now to FIGS. 2B and 18B, in one embodiment, the reception component receives the broadcaster identifiers 1820, whether a broadcaster broadcasts programs, graphical interactive information system applications or both 1821, broadcast program tuned frequency location identifiers 1822, and interactive information system application tuned frequency identifiers 1824 and stores this information in storage device 226.

Referring now to FIGS. 2B and 18C, a desired frequency is located given any of the entries in the broadcaster information table by locating a desired entry 1830, identifying the tuned frequency of the desired broadcaster or interactive information system application 1832 and tuning the desired frequency 1834. For example, if channel 4 contains KRON, the NBC affiliate, broadcasting graphical interactive information system applications on line 14 of the VBI on channel 9, this information is stored in the reception component 234 as described above. An interactive application corresponding to channel 7 may instruct the reception component 234 to switch the tuned frequency of the program channel to the NBC affiliate using a command which only identifies NBC as the target channel. The interactive information system reception component 234 may then identify the proper channel corresponding to the NBC affiliate as channel 4 by locating the desired broadcaster in the broadcaster information table, identifying the tuned frequency or channel of the desired broadcaster from the entry containing the broadcaster information 1832 and switch the tuned frequency of a tuner in reception component to the channel or frequency of the desired broadcaster or application 1834. When tuner 216 is changed to channel 4, either by the user or an interactive information system application, reception component 234 under control of microprocessor 222 using the broadcaster information table can switch tuner 252 to channel 9 and decode the line 14 of the VBI to obtain interactive information system applications corresponding to the broadcast program on channel 4. In one embodiment, the previous channel or application information is stored in storage device 226 to allow the interactive information system to return the user to the original channel 7, for example if the user exits the new application or the interactive information system application on line 14 of the VBI of channel 9 is not received.

Referring now to FIG. 2B, as described above, in one embodiment, information related to interactive information system applications may also be broadcast, received and stored as a part of the broadcaster information table. If graphical interactive information system application number 5407138 will be broadcast by KRON, this information may also be a part of the broadcaster information table, allowing the interactive information system to locate this application upon command, for example, from another interactive information system application, without changing the program channel, for example by changing the tuned frequency of tuner 216 without changing the tuned frequency of tuner 252.

In one embodiment, the developer uses the compact protocol generator and formatter 276 to create interactive information system applications which refer to other applications by using application identifiers, and the graphical interactive information system application server 270 allows the broadcaster to further modify the application by adding available broadcaster information regarding the other applications to allow the reception component to locate the other applications.

V. Image Generation

An application may display the first form when the reception component receives the application header record, the first form definition, including objects for that form, and resources related to the objects on the form. Additional forms may be broadcast while the first form is being displayed. In one embodiment, if the user response causes the application to display a form for which the form definition or one of the required object or resource definitions has not been received by the reception component, the application will wait for 10 seconds for the receipt of the missing information, and if not received, abort the application and display an error message.

Referring now to FIG. 2B, display generator 228 contains an addressable video RAM. When a VGA color code is written into the video RAM of the display generator 228, a pixel appears on the display 230 corresponding to the address of the code written. Thus by sending various bitmaps, the form is displayed. The use of bitmaps and video display adapters is described in Kliewer, *EGA/VGA Programmer's Reference Guide* (2nd. ed., McGraw Hill 1990).

In one embodiment, all color codes are broadcast as VGA color codes. VGA color codes are described in Kliewer, *EGA/VGA Programmer's Reference Guide* (2nd. ed., McGraw Hill 1990). In another embodiment, a different set of color codes are used. In one embodiment, the color code is converted at display time to a color suitable for the reception component by mapping it to another color. For example, some of the VGA color codes are too bright for use on certain displays, such as color televisions, and thus, a 256 entry lookup table is used to convert the VGA code into the acceptable code. In one embodiment, the result of the lookup reduces the saturation of the RGB values by 25%. In another embodiment, codes indicating saturation of the RGB values in the top 25% are held to 75% of the maximum. The 25% value was selected to accommodate the color restrictions imposed by the NTSC video signal standards, and conventional color television circuitry. The lookup table approach can map to any number of colors. In one embodiment, 100 colors are used, another embodiment uses sixteen colors, and another embodiment uses only two colors.

The reception component stores bitmap resources defined using bitmap resource definitions described above in storage device 226. In one embodiment, all text characters in various fonts, styles and type sizes are stored as predefined bitmaps in storage device 224 to allow for rapid display of these characters. In another embodiment, these text characters are stored as outline fonts, and bitmaps are generated from the outline fonts. Other predefined resources are also stored to allow commonly-used objects such as bitmaps of credit cards. Predefined resources are listed in Appendix C.

Figure 19:
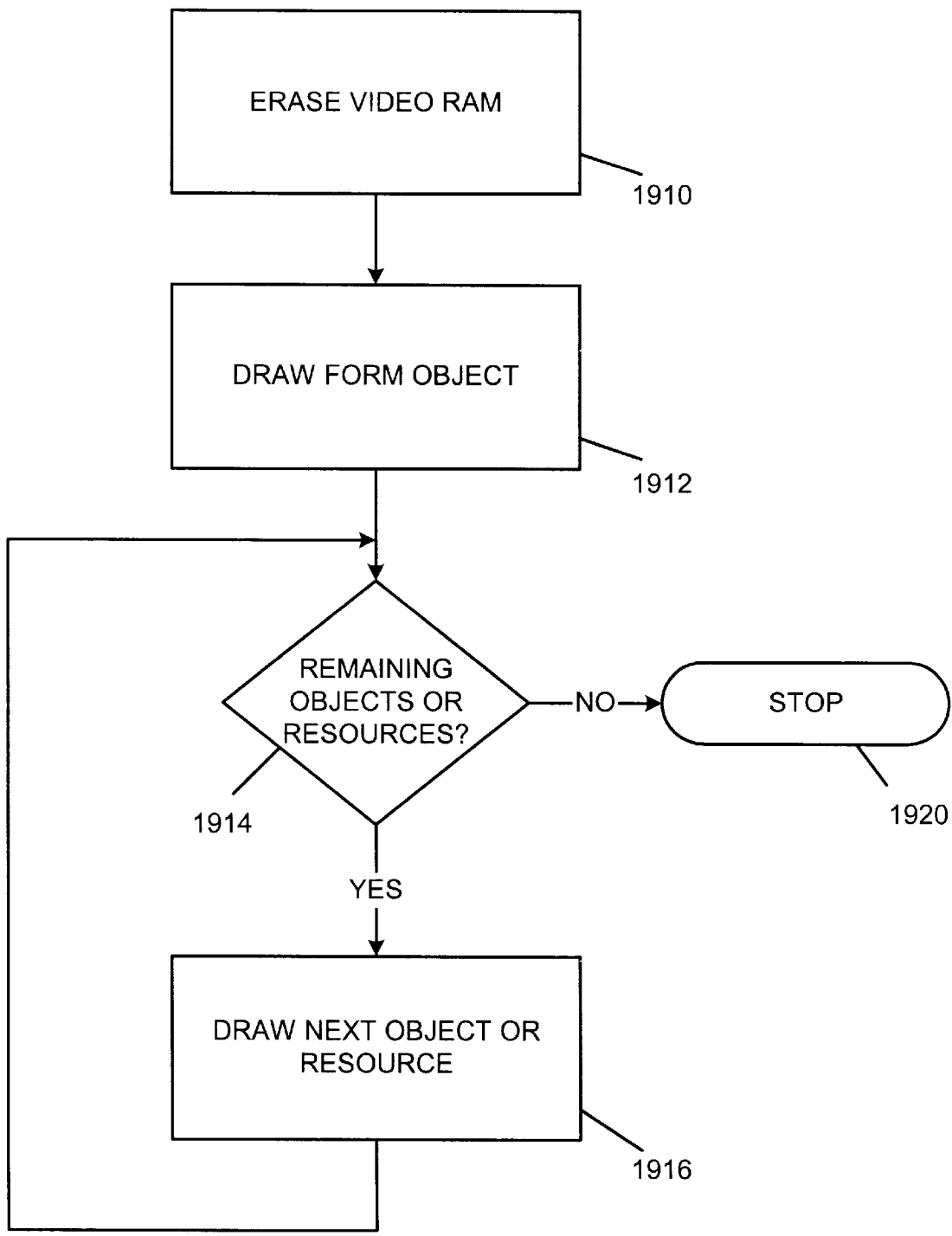
FIG. 19 is a flowchart illustrating a method of drawing a form on a display according to the present invention.

Referring now to FIG. 19, a method of generating the images from the form object and other object definitions is shown. When a display form command is received, either via the broadcast or via a script, the video RAM is erased 1910 and the objects and resources are drawn. In one embodiment, the form object is drawn first 1912, followed by the objects and resources appearing on the form 1914, 1916 until all objects and resources are drawn 1920. This allows the objects and resources to appear overlaid onto the form. Objects and resources are located using the handle tables described above.

Figure 20:
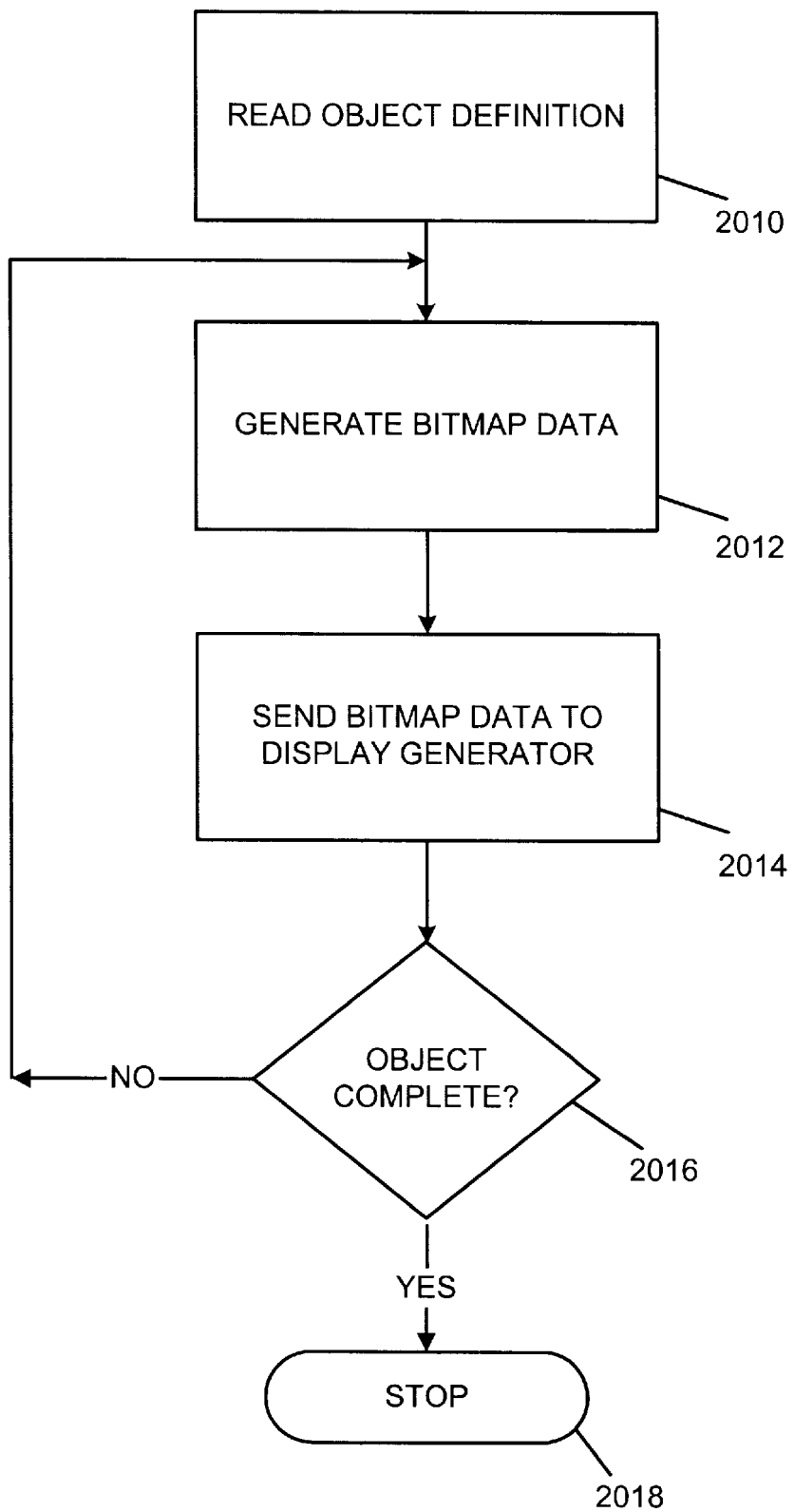
FIG. 20 is a flowchart illustrating a method of drawing an object on a display according to the present invention.

Referring now to FIG. 20, one embodiment of a method of drawing an object is shown. An object is drawn by reading the corresponding object definition 2010, generating a bitmap corresponding to the object definition read 2012 and sending it to the graphics display generator 2014. In one embodiment, the entire bitmap is generated 2012 prior to sending 2014. In another embodiment, portions of the bitmap are generated 2012 and sent 2014 until the entire bitmap is complete 2016, 2018. Generating the bitmap is accomplished by rendering the color of each pixel within the boundary of the object as specified by the object definition.

Figure 21:
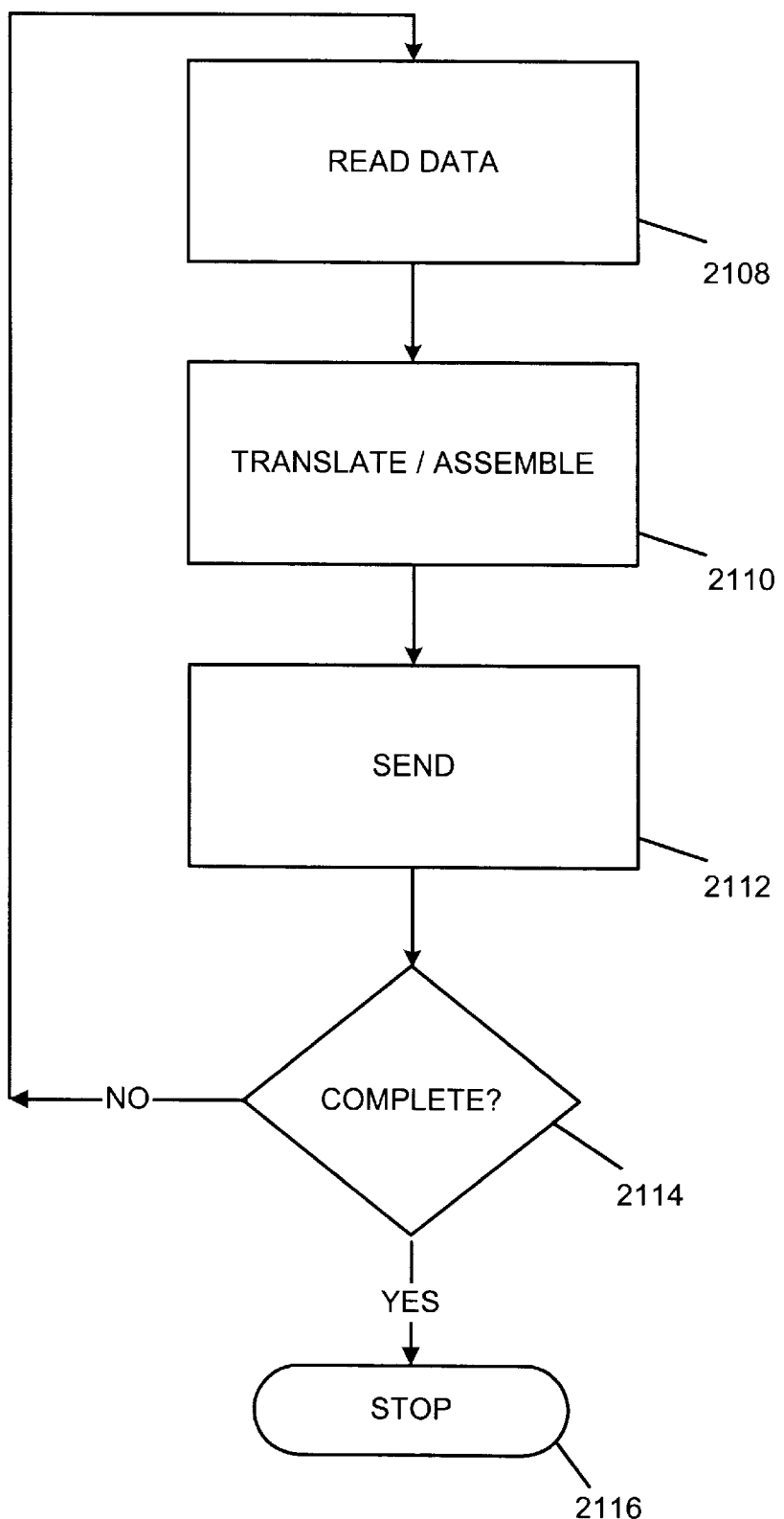
FIG. 21 is a flowchart illustrating a method of drawing a resource on a display according to the present invention.

Referring now to FIG. 21, one embodiment of a method of drawing a resource is shown. Each bit in the bitmap of a resource is read 2108 and translated 2110 into the format of the graphics display generator if required. For example, each bit in a four-color bitmap resource may be translated into a modified VGA color code as described above. The translated bit is sent 2112 to the graphics display generator using the position information in the resource definition for display by the display device. In one embodiment, all of the bits are assembled 2110 into a bitmap prior to sending 2112, and in another embodiment, each bit is sent after translation 2112. The method continues until the resource is drawn 2114, 2116.

VI. Response Generation

When an application allows a response and the user has a reception component capable of transmitting the response, the user may provide response information to a response collector. Referring now to FIG. 2B, in one embodiment, each reception component 234 is assigned a unique code at the time of manufacture and this code is stored in the storage device 224. Individual users of the reception component 234 may also be assigned a unique code. When the user responds to an object which generates a response, the reception component generates a response record to allow the response collector to route the response as described below.

Figure 22:
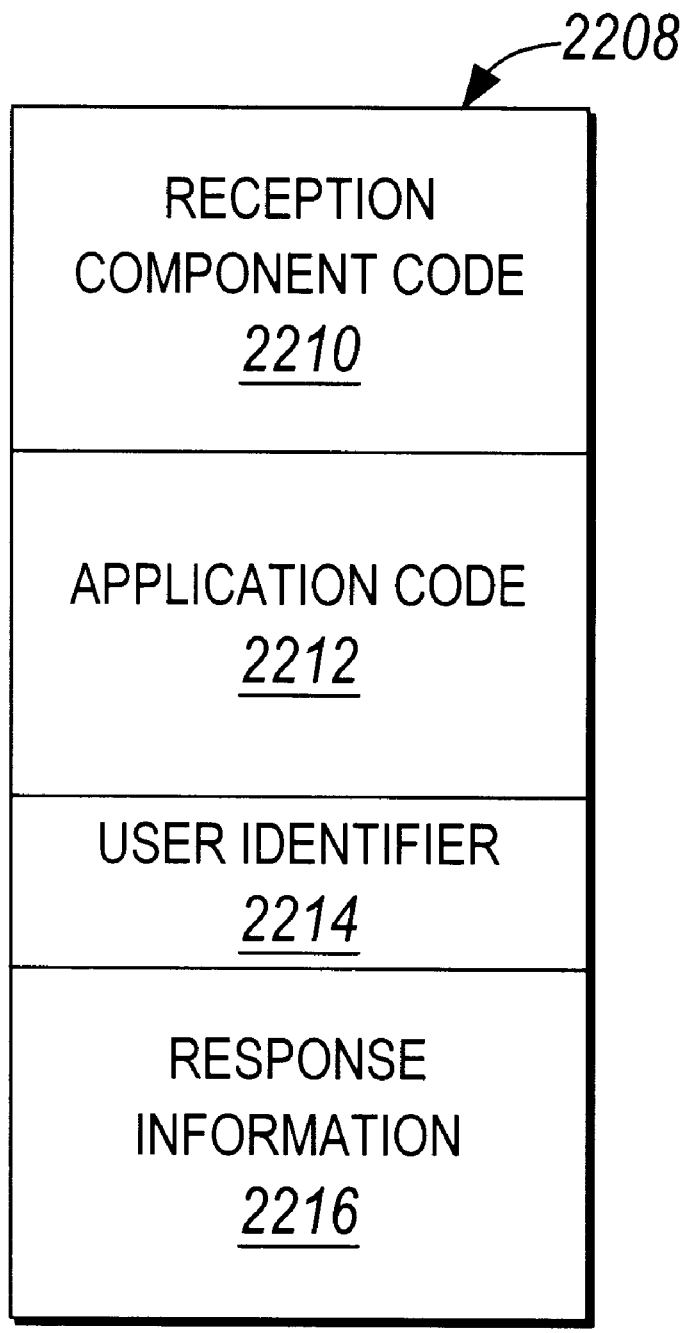
FIG. 22 is a block diagram representing a format of a response record according to one embodiment of the present invention.

Referring now to FIG. 22, one embodiment of a response record 2208 is shown. Long word 2210 contains the unique code of the reception component, and long word 2212 contains the unique application code sent in the application header. Byte 2214 contains a user identifier, to allow the user to distinguish himself from others who may use the reception component. In one embodiment, anonymous responses do not contain the reception component or user identifier 2210, 2214 to allow for the user to maintain anonymity. Block 2216 contains the defined response information byte or bytes described above to designate quantity or product information according to the user's response. In one embodiment, a passcode is maintained in the reception component, and the user is required to enter it to generate the response to the response collector.

Figure 23:
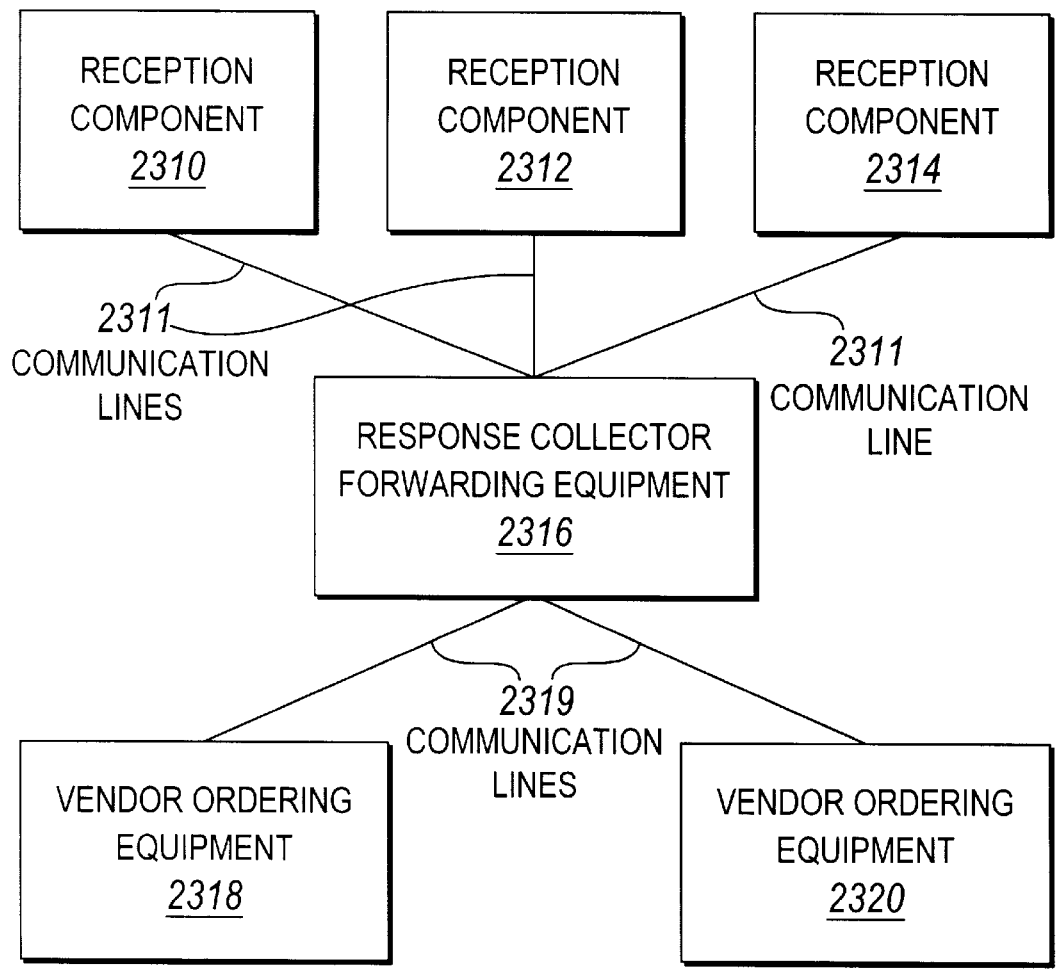
FIG. 23 is a block schematic diagram illustrating a response network according to one embodiment of the present invention.

Referring now to FIG. 23, a response network containing three reception components, one response collector, and two vendors is shown. User reception components 2310, 2312, 2314 are coupled to response collector forwarding equipment 2316 via communication lines 2311. Communication lines 2311 may be permanently connected or temporarily arranged as needed. In one embodiment, communications lines 2311 are arranged through the public switched telephone network when a reception component 2310, 2312, 2314 dials a telephone number of the response collector. In another embodiment, communications lines 2311 are cable television cables. Any form of communication, even using an intermediary such as telephone equipment owned by the telephone company, will allow operation of the present invention. In one embodiment, response collector forwarding equipment 2316 is an industry standard UNIX-based computer system coupled to at least one modem to receive and/or transmit data.

The response collector forwarding equipment 2316 is coupled to vendor ordering equipment 2318, 2320 using communication lines 2319 similar to communication lines 2311 to allow the response collector equipment 2316 to react to the receipt of responses sent by a reception component 2310, 2312, 2314 by sending user information and other information to vendor ordering equipment 2318, 2320 as described below.

Figure 24:
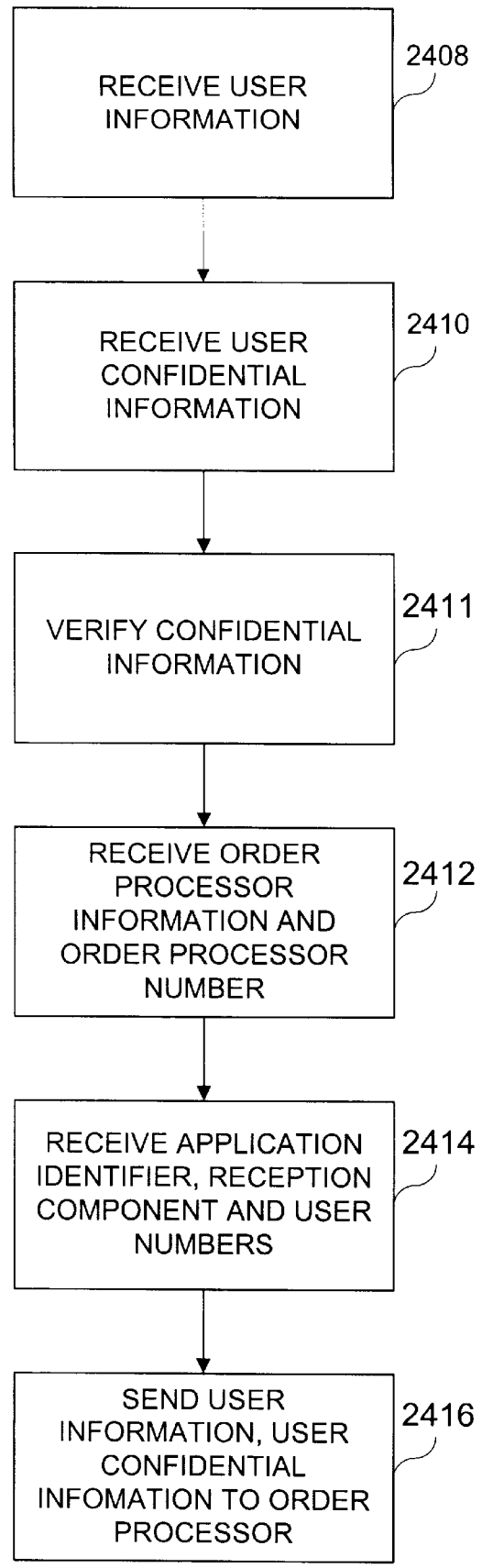
FIG. 24 is a flowchart illustrating a method of allowing a user to use an unsecure communication line to send confidential information to an order processor according to the present invention.

Referring now to FIG. 24 a method of collecting and sending confidential user information such as credit card number to a vendor is shown. The response collector obtains user information such as reception component number, user number, name and address, and confidential information such as credit card number 2408, 2410. In one embodiment, this is accomplished by mail. In another embodiment, this step is accomplished by telephone. In one embodiment, the information is verified, for example by checking the credit card billing address with the address provided by the user 2411.

The response collector obtains routing information and an application identifier from the information provider 2412, and associates the routing information with the application identifier.

The application identifier broadcast to the user as described above and a user reception component and user identifiers are sent to the response collector 2414. Because no confidential information is sent, unsecure communication lines may be used to send the information. The response collector then forwards the user information including user confidential information and response information to the vendor associated with the application identifier received 2416. This step may be accomplished using a secure facility, such as mail or telephone line. The vendor may then provide a service or products to the users address with less likelihood of fraud.

APPENDIX A

Hints

Null
Invisible
Disable
Foreground Color
Background Color
Border Color
Border Style
Border Width
Border Options
Form Transition Effect (Fade Out, etc.)
Form Background Gradient Fill
Clip
Scale to Fit
Scale
Text Private (Not seen—use for passwords, etc.)
Text Numeric
Text Editable
Appearance of Buttons
Key 0
Key 1
Key 2
Key 3
Key 4
Key 5
Key 6
Key 7
Key 8
Key 9
Key Select
Key Up
Key Down
Key Left
Key Right
Key Enter
Key Exit
Key Cancel
Key Buy
No Legend
Keycap Custom
Keycap Round
Keycap Square
Keycap Diamond
Keycap Over
Keycap Under
Keycap Left
Keycap Right
Cursor Related Hints for Systems with Cursors
Box (when cursor is inside box, user may press enter)
No Box (no box needed around object)
List Hints
Highlight Color
List Exclusive
List Exclusive None
List Non Exclusive
List Horizontal
List Vertical
List Sort Ascending
List Sort Descending
List Control Up (Indicates button which makes list scroll)

List Control Down
List Control Left
List Control Right
Timer Hints
Timer Random During Period

APPENDIX B

Script Codes

| Token Value | Arguments | Return Value |
|---|---|---|
| Statements | | |
| IF | 0x10 | |
| WHILE | 0x11 | |
| {function call statement} | 0x12 | |
| RETURN | 0x13 | |
| {integer assignment} | 0x14 | |
| {string assignment} | 0x15 | |
| {boolean assignment} | 0x16 | |
| Expressions | | |
| {integer variable} 0x20 | none | Integer |
| {string variable} 0x21 | none | String |
| {boolean variable} 0x22 | none | Boolean |
| {integer constant} 0x30 | none | Integer |
| {string constant} 0x31 | none | String |
| {boolean constant} 0x32 | none | Boolean |
| <= 0x40 | Integer, Integer | Boolean |
| < 0x41 | Integer, Integer | Boolean |
| {integer equal} 0x42 | Integer, Integer | Boolean |
| {string equal} 0x43 | String, String | Boolean |
| {boolean equal} 0x44 | Boolean, Boolean | Boolean |
| {string compare} 0x45 | String, String | Boolean |
| {is substring} 0x46 | String, String | Boolean |
| AND 0x47 | Boolean, Boolean | Boolean |
| OR 0x48 | Boolean, Boolean | Boolean |
| NOT 0x49 | Boolean | Boolean |
| + 0x60 | Integer, Integer | Integer |
| − 0x61 | Integer, Integer | Integer |
| * 0x62 | Integer, Integer | Integer |
| / 0x63 | Integer, Integer | Integer |
| {mod divide} 0x64 | Integer, Integer | Integer |
| {string concatenation} 0x70 | String, String | String |
| {string extraction} 0x71 | String, Integer, Integer | String |
| {integer object access} 0x80 | Integer, Integer, Integer | Integer |
| {string object access} 0x81 | Integer, Integer, Integer | String |
| {boolean object access} 0x82 | Integer, Integer, Integer | Boolean |
| Delimiters | | |
| {end of string} | 0x00 | |
| {end of statement list} | 0x01 | |

APPENDIX C

Predefined Resources

Navigation & System: 20
  Checkmark
  "X"
  "?"
  i in a blue circle
  Close icon: down arrow.
  Back arrow: 180 degree loop
  Right Arrow: 12 styles
  Padlock
  Magnifying glass
Polls: 4
  Thumbs up
  YES
  Thumbs down
  NO
Payment/Delivery/Ordering: 21
  Visa card
  Mastercard
  American Express card
  Optima Card
  Discover card
  FedEx Logo
  UPS Logo
  DHL logo
  USPS logo
  Airborne Express logo
  Dollar Sign
  Phone
  Fax machine
  Coins
  Money bills
  Price tag
  Brochure
  Pen & paper
  Envelope
  Stamp
  Grocery cart
Entertainment: 10
  Television
  Admission ticket
  Musical notes
  CD
  Audio cassette
  Video cassette
  film strip
  film camera/projector
  Knife & fork
  Wine bottle & glass
News/info: 19
  Watch
  Clock
  Alarm clock
  Globe
  U.S.A. map
  Newspaper
  U.S. flag
  Capitol dome
  stock grid
  car
  airplane
  van
  train
  bus
  Book
  Calendar
  Suitcase
  Beakers
  Nuclear energy symbol
Weather/Almanac: 17
  Sun
  Cloud
  Sun w/cloud Cloud w/rain
Rain drops
Cloud w/snow
Snowflake
Lightning
Tornado
Hurricane
Fog
Full moon
Last quarter
New moon
First quarter
Waves
Thermometer
Sports: 18
  Skier
  Referees whistle
  Combo sports image: baseball, football, basketball
  Soccer ball
  Baseball
  Official baseball logo
  Football
  NFL logo
  Basketball
  NBA logo
  Ice skates
  Hockey puck & stick
  Bowling ball & bowling pins
  Tennis racquet
  Golf putter, golf ball, and tee
  Sailboat
  Boxing gloves
  Horse
Misc: 7
  Key
  Lightbulb
  Graduation cap
  Construction hard hat
  Picture (photograph)
  Road work sign
  Rose

What is claimed is:

1. A method of providing broadcaster information in an interactive information system, the method comprising the steps of:
  storing a plurality of broadcaster identifications, each broadcaster identification associated with a channel;
  receiving, from each of a plurality of broadcasters, broadcaster information identifying a broadcaster and a type of broadcast provided by the broadcaster;
  creating, from the stored plurality of broadcaster identifications and the received broadcaster information, a broadcaster information table specifying, for each of a plurality of channels, the broadcaster identification for, and the type of broadcast provided by, each broadcaster identified in the received broadcaster information by matching the received broadcaster information with the stored plurality of broadcaster identifications; and
  transmitting the broadcaster information table to a reception component, whereby the reception component stores the broadcaster information table and tunes to a channel to receive a broadcast provided by the broadcaster associated with the broadcaster identification for that channel.

2. The method of claim 1, wherein the broadcaster information indicates a transport used by the broadcaster to broadcast a graphical interactive information system application.

3. The method of claim 2, wherein the transport is a vertical blanking interval of a channel.

4. The method of claim 1, wherein the broadcaster information identifies a interactive information system protocol used by the broadcaster.

5. The method of claim 1, wherein the type of broadcast provided from the broadcaster is selected from the group consisting of:
  a program; and
  a graphical interactive information system application.

6. The method of claim 1, wherein the broadcaster information table specifies for each of the plurality of channels:
  whether a channel is available to a user;
  a broadcast frequency corresponding to an available channel; and
  a frequency identifier for tuning the reception component to receive an interactive information system application for a broadcaster broadcasting on the channel.

7. The method of claim 6, wherein the broadcaster information table further specifies:
  call letters for the channel; and
  a network identifier for the broadcaster broadcasting on the channel.

8. A method of providing broadcaster information in an interactive information system, the method comprising the steps of:
  storing a plurality of broadcaster identifications, each broadcaster identification associated with a channel;
  receiving, from each of a plurality of broadcasters, broadcaster information identifying a broadcaster and a transport used by the broadcaster to broadcast a program; and
  creating, from the stored plurality of broadcaster identifications and the received broadcaster information, a broadcaster information table specifying, for each of a plurality of channels, the broadcaster identification for, and the transport used to broadcast a program by, the broadcaster identified by the broadcaster information by matching the received broadcaster information with the stored plurality of broadcaster identifiers.

9. The method of claim 8, wherein the transport is a frequency on which the broadcaster broadcasts a graphical interactive system application.

10. The method of claim 8, wherein the transport is a vertical blanking interval of a channel.

11. The method of claim 8, further comprising the step of:
  transmitting the broadcaster information table to a reception component, whereby the reception component stores the broadcaster information table and tunes to a channel to receive a broadcast provided by the broadcaster associated with the broadcaster identification for that channel.

12. The method of claim 8, wherein the broadcaster information identifies a interactive information system protocol used by the broadcaster.

13. A provider component in a system for delivering interactive information, the provider component comprising:

a memory storing a plurality of broadcaster identifications, each broadcaster identification associated with a channel;

an input receiving, from each of a plurality of broadcasters, broadcaster information identifying a broadcaster and a transport used by the broadcaster to broadcast a program;

a processor, coupled to the input and the memory, for determining from the stored plurality of broadcaster identifications and the broadcaster information at least one channel associated with the identified broadcaster; and a transmitter for transmitting a broadcaster information table to a reception component specifying, for each of a plurality of channels, a broadcaster identification and a transport used to broadcast a program by a broadcaster identified by the broadcaster information for that channel, whereby the reception component stores the broadcaster information table and tunes to a channel to receive a broadcast provided by the broadcaster associated with the broadcaster identification for that channel.

14. The system of claim 13, wherein the transport is a frequency on which the broadcaster broadcasts a graphical interactive system application.

15. The system of claim 13, wherein the transport is a vertical blanking interval of a channel.

16. The system of claim 13, wherein the broadcaster information identifies a program broadcast at a first frequency and an interactive system application broadcast at a second frequency.

17. The system of claim 16, wherein the interactive system application is located at a vertical blanking interval of the second channel.

* * * * *